(12) United States Patent
Galambos et al.

(10) Patent No.: US 11,961,348 B1
(45) Date of Patent: Apr. 16, 2024

(54) SOLID-STATE INFORMATION PATTERN DISCRIMINATING SWITCH

(71) Applicant: National Technology & Engineering Solutions of Sandia, LLC, Albuquerque, NM (US)

(72) Inventors: Paul C. Galambos, Albuquerque, NM (US); Keith Ortiz, Albuquerque, NM (US); Brent T. Meyer, Albuquerque, NM (US); Sean Yen, Albuquerque, NM (US); Gilbert V. Herrera, Columbia, MD (US); Anthony L. Lentine, Albuquerque, NM (US); Gwendolyn Hummel, Albuquerque, NM (US); Robin B. Jacobs-Gedrim, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 409 days.

(21) Appl. No.: 17/532,102

(22) Filed: Nov. 22, 2021

(51) Int. Cl.
*G07C 9/00* (2020.01)
*H03K 17/687* (2006.01)

(52) U.S. Cl.
CPC ..... *G07C 9/00571* (2013.01); *G07C 9/00817* (2013.01); *H03K 17/6872* (2013.01); *G07C 2009/00634* (2013.01)

(58) Field of Classification Search
CPC ............ G07C 9/00571; G07C 9/00817; G07C 2009/00634; H03K 17/6872
See application file for complete search history.

(56) References Cited

U.S. PATENT DOCUMENTS

| | | | |
|---|---|---|---|
| 2003/0229708 A1* | 12/2003 | Lie | H04L 47/22 709/230 |
| 2003/0229710 A1* | 12/2003 | Lie | H04L 63/145 709/231 |
| 2016/0019733 A1* | 1/2016 | Robinton | H04W 4/023 340/5.61 |
| 2017/0046290 A1* | 2/2017 | Samid | G06Q 20/10 |
| 2020/0356085 A1* | 11/2020 | Wentz | H04L 9/0866 |

* cited by examiner

*Primary Examiner* — Seokjin Kim
(74) *Attorney, Agent, or Firm* — Mark A. Dodd

(57) ABSTRACT

A maze-based switch generally having three functional blocks is disclosed. The first functional block handles communications by accepting an entered maze pattern from an external system controller and outputting the entered maze pattern (and optionally its directional complement) to the second functional block. The second functional block stores the maze pattern (and optionally its directional complement) to a permanent storage element and outputs the stored, entered maze pattern and its directional complement to a series of transistors in the third functional block. The third functional block is an electronic maze in which a correct maze pattern and its directional complement must be received by the transistors for the transistors to pass electrical power through the electronic maze to a connected element. The third functional block may alternatively be implemented with optical elements, optoelectronic elements, microelectromechanical elements, or elements formed by other microsystem technologies.

20 Claims, 6 Drawing Sheets

SOLID-STATE INFORMATION PATTERN DISCRIMINATING SWITCH

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a solid-state (including electronic, optoelectronic, microelectromechanical, and other microsystem technologies) switch that requires correct information, represented by a pattern, to operate due to a solid-state maze within the switch. The output of the switch may then be used to control, for example, enable or block, operation of a connected element.

BACKGROUND

Numerous applications require one to enable or disable the actuation of a mechanical latch, to power an electronic circuit, or to direct the flow of information.

The typical software approach to enabling or disabling operation is to enter a password or something equivalent, compare it to a value stored in memory, and, if correct, enable the next instruction. This software approach is subject to error due to coding errors, malicious attacks, or defective hardware that can lead the software to mistakenly authenticate the wrong password or to jump to the wrong instruction.

Systems may also start in an improper state if the system was subjected to a power surge, such as might be experienced during a lightning strike or immediately following a loss of power, i.e., when power is initially restored. In some applications, having a system starting in an improper state can lead to safety issues. Software-based switches may be found in many applications, including electronic latches, the keypads by entry doors or to cars, devices requiring key cards (including automated teller machines (ATMs)), biometric-based systems requiring, for example, a fingerprint, and other applications requiring the authentication of a user with appropriate privileges or the verification of a required set of external conditions, for example, a location.

The typical hardware approach to enabling or disabling operation is the use of a physical key. The key may drive a series of pins in a tumbler to a certain position. If the pins are in the correct position, then the key will turn, and access is granted. This hardware approach is subject to error in that such tumblers can, for example, be picked with the right tools, thereby improperly granting access. Hardware based systems may be found in many applications including keyed tumblers, such as those found on entry doors or to cars.

In some applications the controlling switch may be used repeatedly. In other applications, the switch may be used only once, for example, as in a safety switch, where if the wrong password is entered, access is disabled permanently, or semi-permanently until the system is reset.

Thus, there exists a need for a switch to enable or disable access for various types of elements that is stronger than existing password (software) or key (hardware) controlled access.

SUMMARY

One aspect of the invention relates to a switch that takes a pattern of information and makes a connection to or in a connected element if and only if the pattern of information is correct. Alternatively, another aspect of the invention relates to a switch that takes a pattern of information and breaks a connection to or in a connected element if and only if the pattern of information is correct. In either case, the switch discriminates between a single, correct pattern of information and all other patterns of information. In various aspects of the present invention, the pattern of information may, for example, be a static pattern of information bits, while in other aspects the pattern of information may, for example, be a dynamic pattern of information bits. In still other various aspects of the present invention, the switch can be reset to an initial state, while in other aspects the switch cannot be reset once it has accepted a pattern of information. Various combinations of static and dynamic patterns of information bits as well as resettable and non-resettable switches are envisioned.

An exemplary aspect of the present invention relates to a maze-based switch with three functional blocks. The first functional block handles communications by accepting a pattern of information prescribing a series of turns through a conceptual maze, which will be called direction A and direction B, or A and B, for short, from an external system controller and outputs a corresponding pattern of information in the form of an entered maze pattern, for example, A is true, and optionally its directional complement, for example, B is false, to the second functional block. The second functional block stores the entered maze pattern, and optionally its directional complement, in a permanent storage element and outputs the stored maze pattern and its directional complement to a series of transistors, for example, field effect transistors (FETs), in the third functional block. The third functional block is an electronic maze in which a correct maze pattern must be received by the transistors for the transistors to switch on, for example, to pass power through the electronic maze to a corresponding connected element. In other aspects of the present invention, the first functional block, the second functional block, or the third functional block may include optical elements. When the third functional block includes optical elements, an optical maze may be implemented. The third functional block may alternatively be implemented with optoelectronic elements, microelectromechanical elements, or elements formed by other microsystem technologies.

In a first primary embodiment, a maze-based switch comprises a maze functional block receives an entered maze pattern (the entered maze pattern includes a sequence of T entered maze pattern characters), the maze functional block receives a directional complement of the entered maze pattern (the directional complement of the entered maze pattern includes a sequence of T directional complements of the entered maze pattern characters), the maze functional block stores a sequence of T required maze pattern characters, the maze functional block includes a maze power input, a maze power output, and a string of T stages, each stage of the string of T stages includes a stage power input, a stage power output (the stage power input electrically connected to the maze power input when the stage is a first stage of the string of T stages, the stage power input electrically connected to the stage power output of an immediately previous stage when the stage is not the first stage of the string of T stages, the stage power output electrically connected to the maze power output when the stage is a last stage of the string of T stages), the stage power input electrically connected to the stage power output only when a respective one of the T entered maze pattern characters and a respective one of the directional complement of the T entered maze pattern characters correspond to a respective one of the T required maze pattern characters.

In various embodiments, the stage power input is electrically connected to the stage power output when each of a respective one of the T entered maze pattern characters and each of a respective one of the directional complement of the T entered maze pattern characters correspond to each of a respective one of the T required maze characters for each of the previous stages of the string of T stages; each stage of the string of T stages further includes a first left switch controlled by a respective one of the T entered maze pattern characters, a second left switch controlled by a directional complement of a respective one of the T entered maze pattern characters, and a third left switch ON only when a respective one of the T required maze characters has a first value, the first, second, and third left switches being electrically connected in series between the stage power input and the stage power output, a first right switch controlled by a logical complement of the respective one of the directional complement of the T entered maze pattern characters, a second right switch controlled by a logical complement of the respective one of the T entered maze pattern characters, and a third right switch ON only when a respective one of the T required maze characters has a second value different from the first value, the first, second, and third right switches electrically connected in series between the stage power input and the stage power output, and when the stage power input is electrically connected to the stage power output, the stage power input is electrically connected to the stage power output via the first, second, and third left switches or the first, second, and third right switches.

In other embodiments, the maze functional block stores the sequence of T required maze pattern characters using a plurality of fuses, a plurality of anti-fuses, a nonvolatile memory, a flash memory, a memristor-based memory, a phase-change-based memory, a latching switch-based memory, or hard-wiring; maze functional block includes a plurality of transistors, a plurality of metal-oxide-semiconductor field effect transistors (MOSFETs), a plurality of heterojunction bipolar transistors (HBTs), or a plurality of micro-electro-mechanical system switches; the sequence of T required maze pattern characters is static or dynamic, the sequence of T required maze pattern characters is resettable or non-resettable, when the sequence of T required maze pattern characters is dynamic, the sequence of T required maze pattern characters is a function of a dynamic factor, the maze functional block further includes an input that determines the dynamic factor, and when the sequence of T required maze pattern characters is resettable, each stage of the string of T stages includes a rewritable permanent storage element that stores a corresponding reset character of a reset sequence of T required maze pattern characters.

In still other embodiments, the maze functional block includes N parallel strings of T stages; N is two, a first of the two parallel strings of T stages corresponds to a first entered maze pattern, and a second of the two parallel strings of T stages corresponds to biometric data; the maze functional block includes N serial strings of T stages; each of the T entered maze pattern characters and each of the T required maze pattern characters includes one or more digital bits; when the entered maze pattern is incorrect, the maze functional block is permanently or semi-permanently disabled.

In yet other embodiments, the maze-based switch further comprises a logic/storage functional block that receives the entered maze pattern (the logic/storage functional block stores the entered maze pattern in a permanent storage element), the logic/storage functional block reads out the thus stored entered maze pattern characters from the permanent storage element, the logic/storage functional block outputs the entered maze pattern and the directional complement of the entered maze pattern to the maze functional block; the logic/storage functional block generates the directional complement of the entered maze pattern; the logic/storage functional block stores the directional complement of the entered maze pattern; the permanent storage element includes a nonvolatile memory, a flash memory, a memristor-based memory, a phase-change-based memory, or a latching switch-based memory; the maze-based switch further comprises a first plurality of T opto-isolators (each of the first plurality of T opto-isolators transmits a respective one of the sequence of T entered maze pattern characters from the logic/storage functional block and receives the respective one of the sequence of T entered maze pattern characters at the maze functional block) and a second plurality of T opto-isolators (each of the second plurality of T opto-isolators transmits a respective one of the sequence of the directional complement of the T entered maze pattern characters from the logic/storage functional block and receives the respective one of the sequence of the directional complement of the T entered maze pattern characters at the maze functional block); the logic/storage functional block and the maze functional block are formed on a single integrated circuit or on respective integrated circuits and each integrated circuit includes one of a field programmable gate array, an application specific integrated circuit, or a microcontroller unit (MCU).

In certain embodiments, the maze-based switch further comprises a communication functional block that receives a command including the entered maze pattern, the communication functional block outputs the entered maze pattern to the logic/storage functional block; the communication functional block generates the directional complement of the entered maze pattern and outputs the directional complement of the entered maze pattern to the logic/storage functional block; the maze-based switch further comprises a thermal protection element that disables the maze functional block when the maze-based switch is subjected to a thermal insult, a mechanical protection element that disables the maze functional block when the maze-based switch is subjected to a mechanical insult, and/or an electrical protection element that disables the maze functional block when the maze-based switch is subjected to an electrical insult.

In a second primary embodiment, a maze-based switch comprises a photonic maze functional block that receives an entered maze pattern (the entered maze pattern includes a sequence of T entered maze pattern characters), the maze functional block receives a directional complement of the entered maze pattern (the directional complement of the entered maze pattern includes a sequence of T directional complements of the entered maze pattern characters), the photonic maze functional block stores a sequence of T required maze pattern characters, the maze functional block includes a maze optical power input, a maze optical power output, and a string of T stages, each stage of the string of T stages includes a stage optical power input, a stage optical power output (the stage optical power input optically coupled to the maze optical power input when the stage is a first stage of the string of T stages, the stage optical power input optically coupled to the stage optical power output of an immediately previous stage when the stage is not the first stage of the string of T stages, the stage optical power output optically coupled to the maze optical power output when the stage is a last stage of the string of T stages), the stage optical power input optically coupled to the stage optical power output only when a respective one of the T entered maze pattern characters and a respective one of the directional complement of the T entered maze pattern characters correspond to a respective one of the T required maze characters.

In various embodiments, the stage optical power input is optically coupled to the stage optical power output when each of a respective one of the T entered maze pattern characters and each of a respective one of the directional complement of the T entered maze pattern characters correspond to each of a respective one of the T required maze characters for each of the previous stages of the string of T stages; each stage of the string of T stages further includes an optical switch including a Mach-Zehnder interferometer (an optical input to the optical switch optically coupled to the stage optical power input, a first phase shifter in the optical switch receives a first electrical control signal, a second phase shifter in the optical switch receives a second electrical control signal, the optical switch includes a cross output and a bar output, the bar output optically coupled to the stage optical power output), the first electrical control signal is a respective one of the T entered maze pattern characters and the second electrical control signal is a passed or blocked directional complement of the respective one of the T entered maze pattern characters, the directional complement of the respective one of the T entered maze pattern characters being passed or blocked as a function of a logic level of the respective one of the T entered maze pattern characters or the second electrical control signal is the directional complement of the respective one of the T entered maze pattern characters and the first electrical control signal is a passed or blocked respective one of the T entered maze pattern characters, the respective one of the T entered maze pattern characters being passed or blocked as a function of a logic level of the directional complement of the respective one of the T entered maze pattern characters.

In other embodiments, each stage of the string of T stages further includes a first optical switch including a first Mach-Zehnder interferometer (an optical input to the first optical switch optically coupled to the stage optical power input, a first phase shifter in the first optical switch receives a respective one of the T entered maze pattern characters, the first optical switch includes a first cross output and a first bar output), a second optical switch including a second Mach-Zehnder interferometer (an optical input to the second optical switch optically coupled to the first bar output, a second phase shifter in the second optical switch receives a logical complement of a respective one of the directional complement of the T entered maze pattern characters, the second optical switch includes a second cross output and a second bar output), a third optical switch including a third Mach-Zehnder interferometer (an optical input to the third optical switch optically coupled to the first cross output, a third phase shifter in the third optical switch receives the logical complement of the respective one of the directional complement of the T entered maze pattern characters, the third optical switch includes a third cross output and a third bar output), and a first waveguide (the first waveguide optically coupled between the second cross output and the stage optical power output when a respective one of the T required maze characters has a first value) or a second waveguide (the second waveguide optically coupled between the third bar output and the stage optical power output when a respective one of the T required maze characters has a second value different from the first value).

In still other embodiments, each stage of the string of T stages further includes a first optical switch including a first Mach-Zehnder interferometer (an optical input to the first optical switch optically coupled to the stage optical power input, a first phase shifter in the first optical switch receives a first electrical control signal, the first optical switch includes a first cross output and a first bar output) and a second optical switch including a second Mach-Zehnder interferometer (an optical input to the second optical switch optically coupled to the first bar output, a second phase shifter in the second optical switch receives a second electrical control signal, the second optical switch includes a second cross output and a second bar output, the second cross output optically coupled to the stage optical power output), the first electrical control signal is a respective one of the T entered maze pattern characters and the second electrical control signal is a logical complement of a directional complement of the respective one of the T entered maze pattern characters or the first electrical control signal is a logical complement of the respective one of the T entered maze pattern characters and the second electrical control signal is the directional complement of the respective one of the T entered maze pattern characters.

In yet other embodiments, the photonic maze functional block stores the sequence of T required maze pattern characters using a plurality of waveguides, a plurality of fuses, a plurality of anti-fuses, a nonvolatile memory, a flash memory, a memristor-based memory, a phase-change-based memory, a latching switch-based memory, or hard-wiring; the sequence of T required maze pattern characters is static or dynamic, the sequence of T required maze pattern characters is resettable or non-resettable, when the sequence of T required maze pattern characters is dynamic, the sequence of T required maze pattern characters is a function of a dynamic factor, the maze functional block further includes an input that determines the dynamic factor, when the sequence of T required maze pattern characters is resettable, each stage of the string of T stages includes a rewritable storage cell that stores a corresponding reset character of a reset sequence of T required maze pattern characters, and a respective first electrical control signal and a second electrical control signal for each stage of the string of T stages are functions of a corresponding reset character of the reset sequence of T required maze pattern characters.

In certain embodiments, the maze functional block includes N parallel strings of T stages; N is two, a first of the two parallel strings of T stages corresponds to a first entered maze pattern, and a second of the two parallel strings of T stages corresponds to biometric data; the photonic maze functional block includes one or more optical amplifiers that optically amplifies an optical signal optically coupled to the maze optical power input; each of the T entered maze pattern characters and each of the T required maze pattern characters includes one or more digital bits; when the entered maze pattern is incorrect, the maze functional block is permanently or semi-permanently disabled.

In further embodiments, the maze-based switch further comprises a logic/storage functional block that receives the entered maze pattern (the logic/storage functional block stores the entered maze pattern in a permanent storage element), the logic/storage functional block reads out the stored entered maze pattern characters from the permanent storage element, the logic/storage functional block outputs the entered maze pattern and the directional complement of the entered maze pattern to the maze functional block; the logic/storage functional block generates the directional complement of the entered maze pattern; the logic/storage functional block stores the directional complement of the entered maze pattern; the permanent storage element includes a nonvolatile memory, a flash memory, a memristor-based memory, a phase-change-based memory, or a latching switch-based memory; the maze-based switch further comprises a first plurality of T opto-isolators (each of the first plurality of T opto-isolators transmits a respective one of the sequence of T entered maze pattern characters from the logic/storage functional block and receives the respective one of the sequence of T entered maze pattern characters at the photonic maze functional block), and a second plurality of T opto-isolators (each of the second plurality of T opto-isolators transmits a respective one of the sequence of the directional complement of the T entered maze pattern characters from the logic/storage functional block and receives the respective one of the sequence of the complement of the T entered maze pattern characters at the photonic maze functional block); an operating wavelength of the first plurality of opto-isolators and the second plurality of opto-isolators is different from an operating wavelength of an optical signal optically coupled to the maze optical power input.

In still further embodiments, the maze-based switch further comprises a communication functional block that receives the entered maze pattern, the communication functional block outputs the entered maze pattern to the logic/storage functional block; the communication functional block generates the directional complement of the entered maze pattern and to output the directional complement of the entered maze pattern to the logic/storage functional block; the maze-based switch further comprises a thermal protection element that disables the maze functional block when the maze-based switch is subjected to a thermal insult, a mechanical protection element that disables the maze functional block when the maze-based switch is subjected to a mechanical insult, and/or an electrical protection element that disables the maze functional block when the maze-based switch is subjected to an electrical insult.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1:
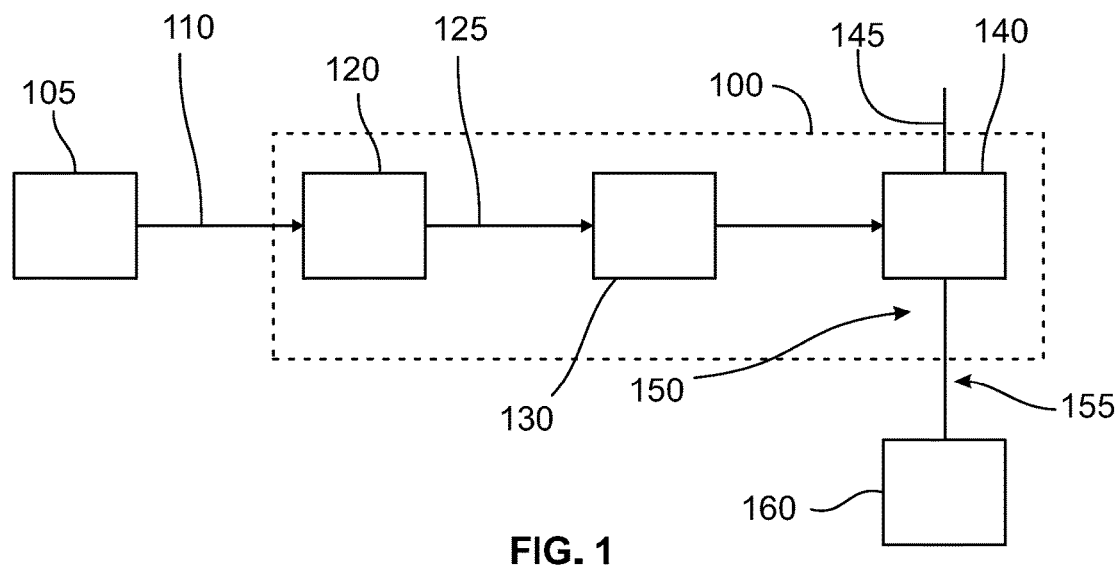
FIG. 1 illustrates the three functional blocks in a solid-state maze-based switch in accordance with one or more embodiments of the present invention.

FIG. 1 illustrates the three functional blocks in a solid-state maze-based switch 100 in accordance with one embodiment. The maze-based switch 100 is adapted for use in a safety switch application, for example, when arming an explosive device or when prohibiting access to a room containing biohazardous material, i.e., the maze-based switch 100 will disable all further attempts at access if the wrong maze pattern is entered. The maze-based switch 100 communicates with an external system controller 105 over an external communication bus 110 using a communication functional block 120. The communication functional block 120 accepts a pattern of information, or a portion thereof, from the external system controller 105. The communication functional block 120 outputs an entered maze pattern (and optionally its directional complement) based on the received pattern of information to a logic/storage functional block 130 over an internal communication bus 125. In other embodiments, the communication functional block 120 outputs just the entered maze pattern based on the received pattern of information, i.e., the communication functional block 120 does not output the directional complement of the entered maze pattern to the logic/storage functional block 130. The logic/storage functional block 130 implements two functions. The first function, implemented by a logic circuit (not illustrated) within the logic/storage functional block 130, is to store the entered maze pattern (and optionally its directional complement if provided or desired) to a permanent storage element (not illustrated). The second function, which may be implemented, at least in part, by the permanent storage element and a readout circuit, is to output the stored entered maze pattern and its directional complement to a series of transistors, for example, field effect transistors (FETs), (not illustrated) in the maze functional block 140. If the entered maze pattern is correct, the plurality of transistors in the maze functional block 140 electrically connect a maze power input 145 of the maze functional block 140 to a maze power output 150 of the maze functional block 140. When the maze power input 145 is electrically connected to the maze power output 150, power passes from the maze power input 145 to the maze power output 150 and on to a connected element 160, for example, a circuit, via a net 155.

In certain embodiments, if the entered maze pattern is correct, the power provided by the maze power output 150 enables operation of the connected element 160, i.e., the connected element 160 is in a normally "OFF" state. In these certain embodiments, the connected element 160 may, for example, be a logic circuit that can now perform a function, a storage element that is now accessible (but that is normally not accessible), or an electromechanical device that can now operate. In other embodiments, if the entered maze pattern is correct, the power provided by the maze power output 150 disables operation of the connected element 160, i.e., the connected element is in a normally "ON" state. In these other embodiments, the connected element 160 may, for example, be a logic circuit that is now inhibited from performing a function, a storage element that is now inaccessible (but that is normally accessible), or an electromechanical device that is now inoperable.

The communication functional block 120 accepts the pattern of information from the external system controller 105 in the form of a digital input. The communication functional block 120 then interprets this digital input and outputs it as the entered maze pattern (and optionally its directional complement) over the internal communication bus 125, with each character of the entered maze pattern (and its optional directional complement) being binary and in the form of either A (and its optional directional complement NOT B), or NOT A (and its optional directional complement B). As used throughout this document, an input A corresponds to ON or a high logic level, while an input NOT A corresponds to OFF or a low logic level. In like manner, an input B corresponds to ON or a high logic level, while an input NOT B corresponds to OFF or a low logic level. For example, an input A and its directional complement NOT B would have values of ON (high) and OFF (low), respectively. Thus, the communication functional block 120 transforms the pattern of information from the received format into the desired entered maze pattern format. The entered maze pattern and its optional directional complement each includes a total of T characters, which corresponds to the number of left/right decisions in the maze functional block 140, as will be described below with reference to FIG. 2. While T may be arbitrarily large (subject to losses in the maze functional block 140), the exact length may be based upon the level of desired complexity, with applications requiring greater complexity having longer maze patterns than those requiring less complexity.

The external communication bus 110 between the communication functional block 120 and the external system controller 105 may employ any suitable protocol. In certain embodiments, the external communication bus 110 may, for example, be a serial bus or a parallel bus. The external communication bus 110 may employ, for example, Controller Area Network (CAN), Ethernet, FireWire, Flexray, Industry Standard Architecture (ISA), Inter-IC (I$^2$C), MIL-STD-1553, Parallel AT Attachment (PATA), Peripheral Component Interconnect (PCI), RS-232, RS-422, RS-485, Serial AT Attachment (SATA), Serial Attached SCSI (SAS), Serial Peripheral Interface (SPI), Small Computer System Interface (SCSI), SpaceWire, UNI/O, or Universal Serial Bus (USB) serial or parallel protocols. While these protocols for the external communication bus 110 reflect use of an electrical communication bus, in at least one other embodiment, the external communication bus 110 is an optical communication bus. As will be appreciated by one of skill in the art, the communication functional block 120 must operate at a speed at least as great as the bus speed of the protocol employed by the external communication bus 110 or portions of the pattern of information from the external system controller 105 may be lost. Typical bus speeds may be in the range of 10 Mb/s to 10 Gb/s.

In at least one embodiment, the communication functional block 120 communicates back to the external system controller 105 that the communication functional block 120 is ready for the next pattern of information, or portion thereof. In at least one other embodiment, there is no communication from the communication functional block 120 back to the external system controller 105, i.e., all communications are one way from the external system controller 105 to the communication functional block 120.

The communication functional block 120 interprets the pattern of information in the form of digital inputs from the external system controller 105 through the external communication bus 110 based on the timing of the external communication bus 110. In at least one embodiment, the communication functional block 120 outputs the characters of the entered maze pattern (and optionally their directional complements) to the logic/storage functional block 130 over the internal communication bus 125 using the same timing as that of the external communication bus 110 or one determined by the external system controller 105. In at least one other embodiment, the communication functional block 120 outputs the characters of the entered maze pattern (and optionally their directional complements) to the logic/storage functional block 130 over the internal communication bus 125 using a different timing than that of the external communication bus 110. In various embodiments the internal communication bus 125 employs either electrical or optical signals and is either a serial or a parallel bus.

The logic/storage functional block 130 implements two functions. The first function is to store the entered maze pattern (and its optional directional complement if provided or generated) to a permanent storage element, where the entered maze pattern (and its optional directional complement) is retained. In at least one embodiment, for example, an application for explosive safety, the entered maze pattern is retained even if the system suffers a loss of power; this ensures both that the maze-based switch 100 need not be reset if power is lost and that the maze-based switch 100 does not lose its place in the entered maze pattern (and its optional directional complement) upon restart. In certain embodiments, the permanent storage element retains the stored entered maze pattern (and its optional directional complement) until it is overwritten by another command from the external system controller 105. For example, in some embodiments, the external system controller 105 may allow a new maze pattern to be entered after a predetermined time if it is a semi-permanent safety switch type maze-based switch 100 and the previously entered maze pattern was incorrect.

A logic circuit within the logic/storage functional block 130 stores each character in the entered maze pattern (and its optional directional complement if provided or generated) to a corresponding cell (or pair of cells) in a permanent storage element. Depending upon the embodiment, the characters in the entered maze pattern (and its optional directional complement) may be stored either serially or in parallel in the corresponding cells in the permanent storage element. As the maze pattern contains T characters, i.e., the maze functional block 140 contains T stages, the permanent storage element in the logic/storage functional block 130 must contain at least T cells (or T pairs of cells for the entered maze pattern and its optional directional complement). To ensure that no characters of the entered maze pattern (or their optional directional complements) are lost during storing, each character (and its optional directional complement) are preferably stored during the same clock cycle in which they were received from the communication functional block 120, or during the immediately following clock cycle.

If the logic/storage functional block 130 receives an entered maze pattern having too many characters, i.e., more than T characters, from the communication functional block 120, in at least one embodiment the logic/storage functional block 130 simply discards all characters after the first T characters. In other embodiments, the logic/storage functional block 130 disables an output signal to the maze functional block 140, as will be described below. In certain embodiments, the logic/storage functional block 130 may cause the communication functional block 120 to send a command to the external system controller 105 that the entered maze pattern had too many characters.

The second function the logic/storage functional block 130 implements is outputting the entered maze pattern and its directional complement to a series of transistors in the maze functional block 140. Note that while inclusion of the directional complement of the entered maze pattern was optional up to this point, the directional complement must be included at this point in the flow of the entered maze pattern. This requirement stems from the fact that, on average, half of the entered maze pattern characters would correspond to the default logic level of the readout circuit. The above noted readout circuit within the logic/storage functional block 130 implements this second function. In those embodiments that store only the entered maze pattern, the readout circuit will need to generate the directional complement of the entered maze pattern as part of this second function. The use of the entered maze pattern character and the directional complement of the entered maze pattern character having the form of A and NOT B (or NOT A and B) provides a higher level of specificity than just A or B. As such, this greater specificity prevents inputs from the external system controller 105, such as A and B, or NOT A and NOT B, from being misinterpreted.

In certain embodiments, the permanent storage elements may be set to a known initial configuration with all permanent storage elements set to not-true, that is, NOT A and NOT B, for each of the T maze stages. In this case, the system controller 105 need only set the value of the direction for each of the T maze stages if true. Conversely, if the initial state is unknown or unspecified, the system controller 105 must set the value of the direction, A or NOT A, and optionally the directional complement, i.e., NOT B (for the A direction) or B (for the NOT A direction).

The number of transistors in the maze functional block 140 that receive the outputted entered maze pattern and its directional complement is proportional to T, the number of characters in the required maze pattern. The outputs to the transistors correspond to the sequence of characters in the entered maze pattern and their directional complements, and will be described below with reference to FIGS. 6 and 7. To energize the connected element 160, the outputted sequence of characters in the entered maze pattern and their directional complements to the series of transistors must match the required maze pattern. One may think of the required maze pattern as a sequence of left and right turns required to successfully navigate the maze. If the entered maze pattern and its directional complement correspond to the required maze pattern, then one will turn left and right in the correct sequence, thereby electrically connecting the maze power input 145 to the maze power output 150. If the entered maze pattern is incorrect, then one virtually makes a right turn when one should have turned left, or vice-versa. Thus, if an incorrect maze pattern is entered, then power is blocked from passing through the maze functional block 140, i.e., the maze power input 145 is not electrically connected to the maze power output 150. In the embodiments that disable an output signal to the maze functional block 140, for example, to the last transistors, upon receiving too many characters, one may think of the disabled transistors as forcing one to go straight when one should turn either left or right.

As before, to ensure that no characters of the entered maze pattern or their directional complements are lost when output to the transistors in the maze functional block 140, the output to each transistor preferably occurs during the same clock cycle in which the entered maze pattern character (and its optional directional complement) were stored in the permanent storage element, or during the immediately following clock cycle. Alternatively, the logic/storage functional block 130 may simultaneously output all the entered maze pattern characters and their directional complements to the transistors in the maze functional block 140 after having received the last entered maze pattern character.

In some embodiments, the required maze pattern in the maze functional block 140 is wired and cannot be changed. In other embodiments, as will be described below, an end user may set (or change) the required maze pattern. Various methods of wiring allow flexibility in implementing the required maze pattern sequence, with a step after fabrication being to set and verify the required maze pattern in the transistors. Only when the entered maze pattern and its directional complement correspond to the required maze pattern will the transistors be activated so that the transistors will pass power. If the entered maze pattern and its directional complement do not correspond to the required maze pattern, the transistors corresponding to the first incorrect character of the entered maze pattern are in their default power hold-off configuration and no power can get through the maze. To this end, each individual transistor must be able to hold off, i.e., block, the full power (voltage) applied to the maze power input 145.

The transistors in the maze functional block 140 will have some "ON" resistance. This resistance will be multiplied due to the presence of T stages, with each stage having multiple transistors, in series between the maze power input 145 and the maze power output 150 of the maze functional block 140. This will cause a corresponding power (voltage) drop between the maze power input 145 and the maze power output 150. Thus, to counter this power (voltage) drop, one must ensure sufficient power (voltage) at the maze power input 145. For this reason, while the communication functional block 120 and the logic/storage functional block 130 may operate on 3.3 V, the input to the maze functional block 140 may, for example, be in the range of 12-15 V, depending upon the technology and circuit topology used to form the maze functional block 140.

Figure 2:
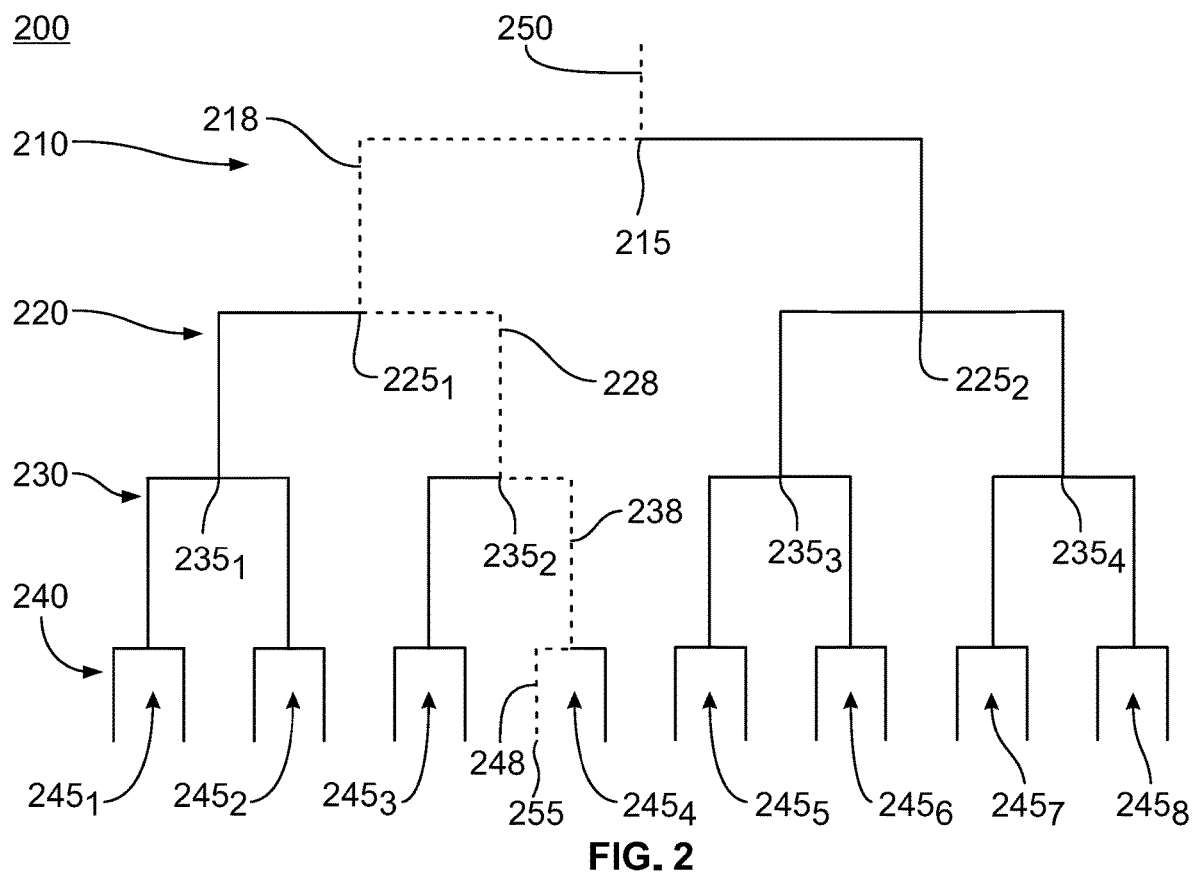
FIG. 2 illustrates a four-level tree corresponding to a maze in accordance with one or more embodiments of the present invention.

While the maze functional block 140 has been described using a maze analogy, a tree analogy may also be used. For example, FIG. 2 illustrates a four-level tree 200, i.e., T=4, which illustrates all sixteen potential required maze patterns. As illustrated, the correct, required maze pattern is the sequence ABBA, with A denoting left and B denoting right. In FIG. 2, the required maze pattern sequence is denoted by a thick dashed line. At the first decision level 210, there is a single decision point 215. If the first entered maze pattern character is A, then the path takes the correct left branch 218 of the four-level tree 200. At the second decision level 220, there are two decision points $225_1$ and $225_2$, though only decision point $225_1$ is on the correct branch 228 of the required maze pattern of ABBA. If the second entered maze pattern character is B, then the path takes the correct right branch 228 of the four-level tree 200. At the third decision level 230, there are four decision points $235_1$-$235_4$, though only decision point $235_2$ is on the correct branch 238 of the required maze pattern of ABBA. If the third entered maze pattern character is B, then the path takes the correct right branch 238 of the four-level tree 200. At the fourth decision level 240, there are eight decision points $245_1$-$245_8$, though only decision point $245_4$ is on the correct branch 248 of the required maze pattern of ABBA. If the fourth entered maze pattern character is A, then the path takes the correct left branch 248 of the four-level tree 200. If any of the entered maze pattern characters is incorrect, then a path for transmitting power is not established from the input 250 to the output 255 of the four-level tree 200 as any incorrect entered maze pattern character blocks power from passing to the next decision level.

In some embodiments, the external system controller 105 may separately enable power (voltage) to the maze power input 145 of the maze functional block 140. This may occur either before or after the logic/storage functional block 130 outputs the entered maze pattern and its directional complement to the transistors in the maze functional block 140. Note that power to operate the maze functional block 140 itself is preferably provided before the logic/storage functional block 130 outputs the entered maze pattern and its directional complement to the transistors in the maze functional block 140. With these embodiments, the power to the maze power input 145 of the maze functional block 140 must be provided by a separate connector to the maze-based switch 100, i.e., it is not provided by the bus that provides power for the communication functional block 120 and the logic/storage functional block 130. These embodiments therefore provide an added layer of safety as they may protect the maze functional block 140 from power surges that might damage the maze functional block 140. These embodiments also provide an added layer of protection as they require execution of an additional command beyond just the entry of the correct, i.e., required, maze pattern. These embodiments also permit one to "close" the maze-based switch 100 before operation of the connected element 160 is required.

Still other embodiments employ two maze-based switches. In these embodiments, a first maze-based switch receives a first entered maze pattern, and if it corresponds to the required maze pattern for the first maze-based switch, then the first maze-based switch connects power to the maze power input of the maze functional block of the second maze-based switch. The second maze-based switch receives a second entered maze pattern and, if it corresponds to the required maze pattern for the second maze-based switch, then the power connected to the maze power input of the maze functional block of the second maze-based switch is connected to the maze power output of the second maze-based switch. These embodiments are thus essentially a cascade of two maze-based switches, with the second maze-based switch effectively being the connected element of the first maze-based switch. As will be appreciated by one of skill in the art, any number of maze-based switches may be cascaded in this manner, subject to the need that the power (voltage) at the output of the last maze-based switch is great enough to run the final connected element. To overcome this need for sufficient power (voltage) at the output, one may drive an input to a relay with the maze power output, with the output of the relay coupled to a corresponding power supply.

While the above described a two-dimensional maze of left and right turns, other embodiments may include more than two dimensions. For example, some embodiments may employ a three-dimensional maze that includes the left and right turns of the above-described embodiment, but also includes up and down options, thereby adding to the complexity of the maze. In still other embodiments, the maze may be N-dimensional by requiring more complex inputs. For example, instead of a single digital bit character to denote left or right, i.e., a two-dimensional maze, one could employ a character having two digital bits to create a three-dimensional maze. As will be appreciated by one of skill in the art, the use of characters having even more digital bits can result in even higher dimensional mazes.

The communication functional block 120, the logic/storage functional block 130, and the maze functional block 140 may be implemented in any suitable manner. For example, the communication functional block 120 and the logic/storage functional block 130 may be implemented, at least in part, by a field programmable gate array (FPGA), an application specific integrated circuit (ASIC), or a microcontroller unit (MCU). Note that the communication functional block 120 and the logic/storage functional block 130 may be implemented, at least in part, using a corresponding pair of FPGAs, ASICs, or MCUs. Alternatively, the communication functional block 120 and the logic/storage functional block 130 may both be implemented, at least in part, using a single FPGA, ASIC, or MCU. The maze functional block 140 may be implemented, at least in part, by an ASIC. The maze functional block 140 may be implemented in a single ASIC along with the communication functional block 120 and the logic/storage functional block 130, in three individual corresponding ASICs, or in some combination thereof. Certain embodiments of the maze functional block 140 may be fabricated, at least in part, in a higher power electronics technology, for example, one employing heterojunction bipolar transistors (HBTs) or silicon power FETs. The use of HBTs or silicon power FETs in the maze functional block 140 reduces the amount of power loss when the maze power input 145 is electrically connected to the maze power output 150. Other embodiments of the maze functional block 140 may be fabricated, at least in part, using various micro-electro-mechanical system (MEMS) switches, for example, piezoelectric or electrostatic switches.

While the above-described embodiments employed electrical signals for the outputs from the logic/storage functional block 130 to the series of transistors in the maze functional block 140, other embodiments employ optical signals. At least one embodiment employs opto-isolators, which include, for example a vertical cavity surface emitting laser (VCSEL) for the transmitter and a photodiode (PD) for the receiver, as an optical link. In other embodiments, nano-photonics may be employed. This optical communication process is simplified due to it being only one-way communication as there is no communication from the maze functional block 140 back to the logic/storage functional block 130.

One key benefit of this optical communication process is that it can provide electrical isolation between the logic/storage functional block 130 and the maze functional block 140, thereby potentially improving both safety and protection. For example, optical isolation ensures that a short or a power surge in either the communication functional block 120 or the logic/storage functional block 130 is not transmitted to the maze functional block 140. Additional safety and protection may be achieved by incorporating fusing circuits into the logic/storage functional block 130 to prevent a short or power surge from activating all the VCSEL signals at once.

In at least one embodiment employing optical isolation, the transmitting VCSELs are included as part of the logic/storage functional block 130 while the receiving PDs are included as part of the maze functional block 140. This approach ensures that the logic/storage functional block 130 is electrically isolated from the maze functional block 140, especially if the logic/storage functional block 130 and the maze functional block 140 are located on separate boards or implemented with separate integrated circuits.

To provide additional safety and protection to the maze functional block 140 and the connected element 160, the maze functional block 140 of certain embodiments may include fuse circuits at one or both of the maze power input 145 and the maze power output 150 of the maze functional block 140. These fuse circuits prevent bypass power from passing through the maze functional block 140 and making it to the connected element 160. In at least some embodiments, these fuse circuits may, for example, be implemented with Zener diodes.

In another approach to provide additional safety and protection to the maze-based switch 100, certain embodiments may include additional protection elements. These additional protection elements may protect the maze-based switch 100 from thermal, mechanical, or electrical insults, or some combination thereof. These protection elements disable the maze-based switch 100 when, for example, sudden changes in temperature occur (the maze-based switch 100 is exposed to a fire), the maze-based switch 100 is subjected to mechanical abuse (the maze-based switch 100 is hit by shrapnel from a nearby explosion), or the maze-based switch 100 is subjected to an overvoltage (a high voltage is applied to a contact or lead, such as may occur during a lightning strike). These additional protection elements may permanently or only temporarily disable the maze-based switch 100.

Figure 3:
FIG. 3 illustrates a communication functional block in accordance with one or more embodiments of the present invention.

FIG. 3 illustrates a communication functional block 300 in accordance with an embodiment of the present invention. The communication functional block 300 includes a signal input 310, which, depending on the implementation, may be a serial or a parallel bus. The signal input 310 carries commands or data, including, for example, the pattern of information that corresponds to the entered maze pattern. Outputs from the communication functional block 300 include an entered maze pattern character output 320 for the entered maze pattern character, and an optional entered maze pattern character directional complement output 325 for the directional complement of the entered maze pattern character. When optional entered maze pattern character directional complement output 325 is included, its output logic level will be generated by logic within the communication functional block 300. The communication functional block 300 may further include a Write_Output 330 to indicate to the logic/storage functional block 130 that an entered maze pattern character is available. As with the signal input 310, the entered maze pattern character output 320 and the optional entered maze pattern character directional complement output 325 may each be a serial or a parallel bus depending upon the implementation. When a parallel bus is employed, the communication functional block 300 may output multiple entered maze pattern characters (and optionally multiple entered maze pattern character directional complements) simultaneously.

Figure 4:
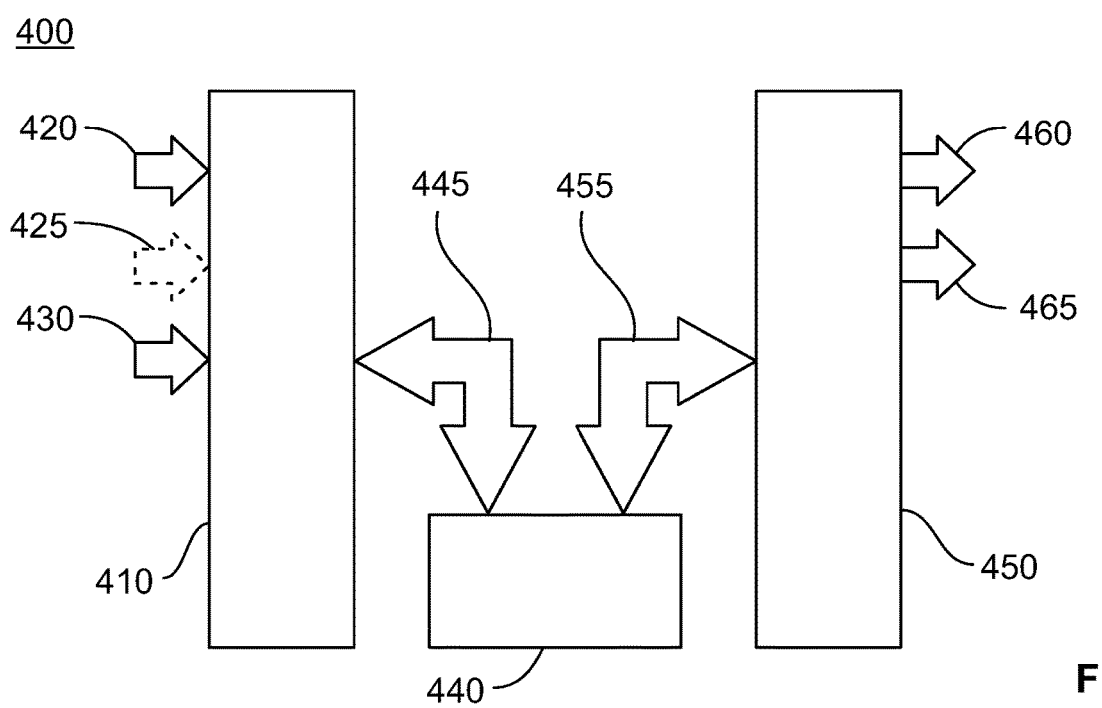
FIG. 4 illustrates a logic/storage functional block in accordance with one or more embodiments of the present invention.

FIG. 4 illustrates a logic/storage functional block 400 in accordance with an embodiment of the present invention. The logic/storage function block 400 includes storing logic circuitry 410 for storing the received entered maze pattern (and the optional entered maze pattern directional complement if provided or generated) to a permanent storage element 440 via a bus 445. Inputs to the storing logic circuitry 410 include an entered maze pattern character input 420 and an optional entered maze pattern character directional complement input 425 electrically coupled to the entered maze pattern character output 320 and the optional entered maze pattern character directional complement output 325, respectively, of the communication functional block 300. The storing logic circuitry 410 also includes a Write_Input 430 electrically coupled to the Write_Output 330 of the communication functional block 300. In certain embodiments, the storing logic circuitry 410 may generate the entered maze pattern directional complement if one desires storing both the entered maze pattern and the entered maze pattern directional complement in the permanent storage element 440, but only the entered maze pattern is received from the communication functional block 300.

The logic/storage functional block 400 further includes a readout circuit 450 for reading out the entered maze pattern characters (and the optional entered maze pattern directional complement characters if stored) from the permanent storage element 440 via a bus 455. If the permanent storage element 440 does not store the optional entered maze pattern directional complement characters, then the readout circuit 450 includes circuitry to generate the entered maze pattern directional complement characters. (This contrasts with those embodiments that generate the entered maze pattern directional complement characters in the communication functional block 120 or in the storing logic circuitry 410.)

The outputs of the readout circuit 450 include A_Maze_Output 460 and B_Maze_Output 465, with A_Maze_Output 460 corresponding to the entered maze pattern characters and B_Maze_Output 465 corresponding to the entered maze pattern directional complement characters. A_Maze_Output 460 and B_Maze_Output 465 each includes T individual signal lines to output the individual characters of the entered maze pattern and their directional complements to respective ones of the transistors in the maze functional block 140. In some embodiments, A_Maze_Output 460 and B_Maze_Output 465 each includes a multiplexer and a single signal line, with the maze functional block 140 including a demultiplexer to couple the entered maze pattern characters and their directional complements to respective ones of the transistors in the maze functional block 140.

In some embodiments, the logic/storage functional block 400 outputs the entered maze pattern and its directional complement "passively" as opposed to the "active" output scheme just described. In this passive output scheme, the logic/storage functional block 400 permits the maze functional block 140 to sense the entered maze pattern and its directional complement stored in the permanent storage element 440. For example, the maze functional block 140 may transmit an optical signal to the permanent storage element 440 via the readout circuit 450, and sense whether the optical signal is reflected or not, thereby reading out an entered maze pattern character or its directional complement.

In some embodiments, the A_Maze_Output 460 and B_Maze_Output 465 are coupled to corresponding sets of opto-isolators (not illustrated) for outputting the entered maze pattern and its directional complement to the series of transistors in the maze functional block 140.

The permanent storage element 440 may employ any suitable type of storage having enough cells to store the entered maze pattern (and the optional entered maze pattern directional complement if provided or generated). The permanent storage element 440 may, for example, employ nonvolatile memory, flash memory, TaOx resistive memory, i.e., memristors, $Ge_2Sb_2Te_5$ (GST) phase-change (PC) memory, $Ge_{50}Te_{50}$ (GeTe) PC memory, or a latching switch-based memory. Note that nonvolatile memory or flash memory will more likely be used in applications in which the maze-based switch 100 acts as a semi-permanent safety switch as the nonvolatile memory or flash memory can be reset. Conversely, the TaOx resistive memory, the GST PC memory, the GeTe PC memory, or the latching switch-based memory will more likely be used in applications in which the maze-based switch 100 acts as a permanent safety switch as these types of permanent elements cannot, or at least cannot readily, be reset. Due to its functional requirements, the permanent storage element 440 cannot employ, for example, typical Random-Access Memory (RAM) or Dynamic Random-Access Memory (DRAM) as these types of memory are volatile and would lose the entered maze pattern (and the optional entered maze pattern directional complement) if power is lost to the maze-based switch 100.

Figure 5:
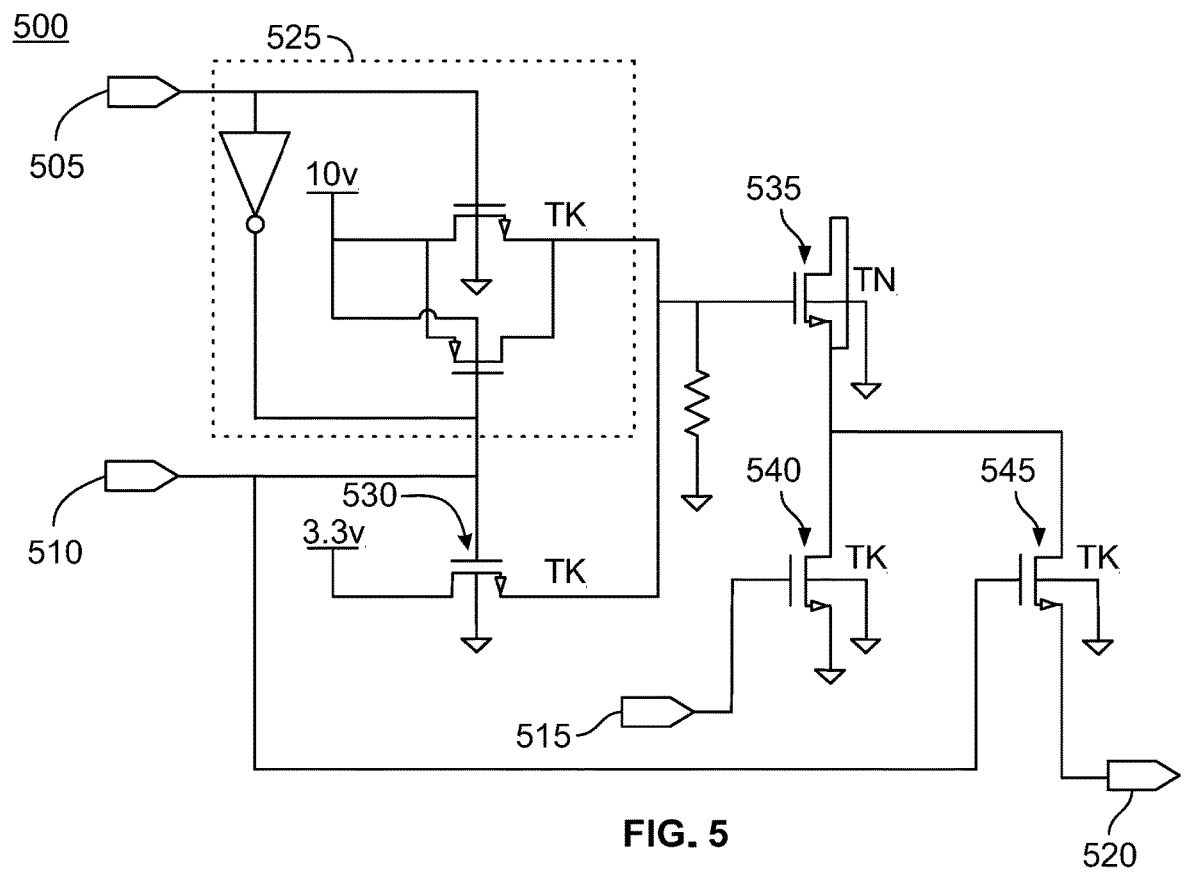
FIG. 5 illustrates a CMOS circuitry implementation of a single stage of a logic/storage functional block in accordance with one or more embodiments of the present invention.

FIG. 5 illustrates one, of many potential, CMOS circuitry implementations of a portion of a single stage 500 of the logic/storage functional block 400 described above with reference to FIG. 4. The stage 500 includes a high voltage logic input 505, with the high voltage logic input 505 having a voltage level of 10 V when ON and 0 V when OFF in the embodiment illustrated in FIG. 5. The high voltage logic input 505 will be ON, i.e., 10 V, when the entered maze pattern character for the stage 500 is A, and will be OFF, i.e., 0 V, when the entered maze pattern character for the stage is NOT A. The stage 500 includes a Read_Enable 510 that will be ON when the stage 500 is being read and OFF when the stage 500 is not being read. The Read_Enable 510 employs a traditional voltage level, for example, 3.3 V in the embodiment illustrated in FIG. 5. The stage 500 includes a Write_Enable 515 that will be ON when the stage 500 is being written to and OFF when the stage 500 is not being written to. The Write_Enable 515, like the Read_Enable 510, employs a traditional voltage level, for example, 3.3 V in the embodiment illustrated in FIG. 5. Lastly, the stage 500 includes an output 520, which corresponds to the stage 500 output for A_Maze_Output 460.

When an entered maze pattern character is being written to the stage 500, the Write_Enable 515 will be ON, which turns on transistor 540, thereby coupling the source of a transistor 535 to ground. (Read_Enable 510 will be OFF.) When the entered maze pattern character is A, then the high voltage logic input 505 will be ON, which turns on a high voltage transmission gate 525, thereby applying 10 V to the gate of the transistor 535. As illustrated in FIG. 5, the gate oxide thickness (TK) for the transmission gate 525 and most of the remaining transistors 530, 540, 545 is thick enough to withstand the application of 10 V. In contrast, the transistor 535 has a gate oxide thickness (TN) that is not thick enough to withstand the application of 10 V, i.e., it permanently breaks down. Thus, when the entered maze pattern character is A, 10 V is applied to the gate of the transistor 535, thereby creating a short between the gate and the source, i.e., the transistor 535 acts as an anti-fuse. In contrast, when the entered maze pattern character is NOT A, 0 V is applied to the gate of the transistor 535, which the gate can withstand, thereby leaving the transistor 535 intact. As will be appreciated by one of skill in the art, the described stage 500 is a one-time programmable stage due to the nature of the thin gate oxide employed in the transistor 535.

When an entered maze pattern character is being read from the stage 500, the Read_Enable 510 will be ON, which turns on the transistors 530, 545. (Write_Enable 515 will be OFF.) With the transistor 530 on, this couples 3.3 V to the gate of the transistor 535. When the entered maze pattern character is A, then the gate and source of the transistor 535 are shorted together, which in turn couples the 3.3 V on the gate of the transistor 535 to the drain of the transistor 545. As the transistor 545 is on, the 3.3 V on the drain of the transistor 545 is transferred to the source of the transistor 545, thereby driving the output 520 to 3.3 V, i.e., to the ON state. In contrast, when the entered maze pattern character is NOT A, the transistor 535, which is intact, turns on and the voltage at both the drain and the source of the transistor 535, which are tied together, is approximately at 0 V. This 0 V at the source of the transistor 535 is coupled to the drain of the transistor 545. As the transistor 545 is on, the 0 V on the drain of the transistor 545 is transferred to the source of the transistor 545, thereby driving the output 520 to 0 V, i.e., to the OFF state.

While the above description of the stage 500 described storing the A value of the entered maze pattern character, a corresponding stage 500 would be used in certain embodiments to store the B value of the entered maze pattern character. In other embodiments, only the A value of the entered maze pattern character is stored, but the B value of the entered maze pattern character is generated by including an inverter (not illustrated) in the stage 500. This inverter would be coupled to the output 520 and the output of the inverter would correspond to the stage 500 output for B_Maze_Output 465.

Figure 6:
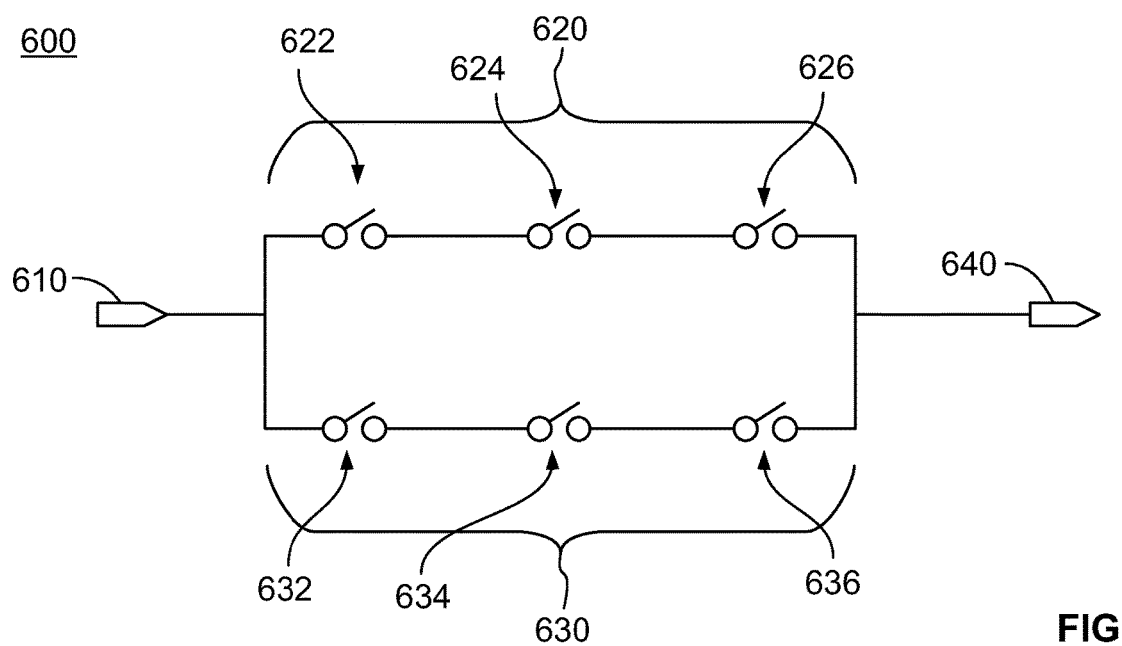
FIG. 6 illustrates the functionality of a single stage of a maze functional block in accordance with one or more embodiments of the present invention.

FIG. 6 illustrates the functionality of a single stage 600 of the maze functional block 140, with the overall maze functional block 140 including T serial copies of the single stage 600. The single stage 600 includes a stage power input 610, which would be electrically connected to a stage power output 640 of an immediately previous single stage 600 in the maze functional block 140, or to the maze power input 145 if the single stage 600 is the first of the T serial copies of the single stage 600. The single stage 600 includes a left branch 620 and a right branch 630. The left branch 620 includes two serial switches 622, 624 that are closed with the inputs A and NOT B, respectively, i.e., A and its directional complement NOT B. The right branch 630 includes two serial switches 632, 634 that are closed with the inputs B and NOT A, respectively, i.e., the logical complement of the directional complement B and the logical complement of A. The inputs to these switches 622, 624, 632, 634 come from the logic/storage functional block 130, for example, the A_Maze_Output 460 and the B_Maze_Output 465 described above with respect to FIG. 4. Upon receiving an entered maze pattern character and its directional complement, the switches 622, 624, 632, 634 in only one of the left branch 620 or the right branch 630 will be closed at a time, and will be a function of the corresponding character in the entered maze pattern and its directional complement. The left branch 620 and the right branch 630 each includes a third serial switch 626, 636, respectively. Thus, the left branch 620 includes three switches 622, 624, 626 electrically connected in series between the stage power input 610 and the stage power output 640, while the right branch 630 includes three switches 632, 634, 636 electrically connected in series between the stage power input 610 and the stage power output 640. In one embodiment, these third serial switches 626, 636 are set at the factory and reflect the corresponding character in the required maze pattern. Again, only one of these third serial switches 626, 636 will be closed while the other will be open due to the required maze pattern character. The third serial switches 626, 636 are both electrically connected to the stage power output 640 of the single stage 600. If the character of the entered maze pattern and its directional complement correspond to the character of the required maze pattern, then all the switches in either the left branch 620 or the right branch 630 will be closed, but not both branches 620, 630. In this manner the stage power input 610 will be electrically connected to the stage power output 640 via either the left branch 620 or the right branch 630 if the character of the entered maze pattern and its directional complement correspond to the corresponding character in the required maze pattern. As will be appreciated by one of skill in the art, the specific order of the three serial switches 622, 624, 626 in the left branch 620 and the specific order of the three serial switch 632, 634, 636 in the right branch 630 is arbitrary. As will also be appreciated by one of skill in the art, the functionality of the single stage 600 may readily be implemented in CMOS circuitry, for example, as illustrated in FIG. 7.

Two special cases exist for which the single stage 600 will block power from the stage power input 610 from reaching the stage power output 640, i.e., no power will reach the stage power output 640 in each of these cases. The first of these cases is when the entered maze pattern character A input and the entered maze pattern character B input are both low. In this case, switches 624 and 634 will be closed, but switches 622 and 632 will be open. Thus, regardless of whether the required maze pattern character is A NOT B or B NOT A, any power (voltage) at the stage power input 610 will not make it to the stage power output 640 due to at least one open switch 622, 632 in the left branch 620 and right branch 630, respectively. Thus, an attempt to bypass a single stage 600 by setting both A and B low, i.e., NOT A NOT B, will fail.

The second case is when the entered maze pattern character A input and the entered maze pattern character B input are both high. In this case, switches 622 and 632 will be closed, but switches 624 and 634 will be open. Thus, regardless of whether the required maze pattern character is A NOT B or B NOT A, any power (voltage) at the stage power input 610 will not make it to the stage power output 640 due to at least one open switch 624, 634 in the left branch 620 and right branch 630, respectively. Thus, an attempt to bypass a single stage 600 by setting both A and B high, i.e., A B, will likewise fail.

Figure 7:
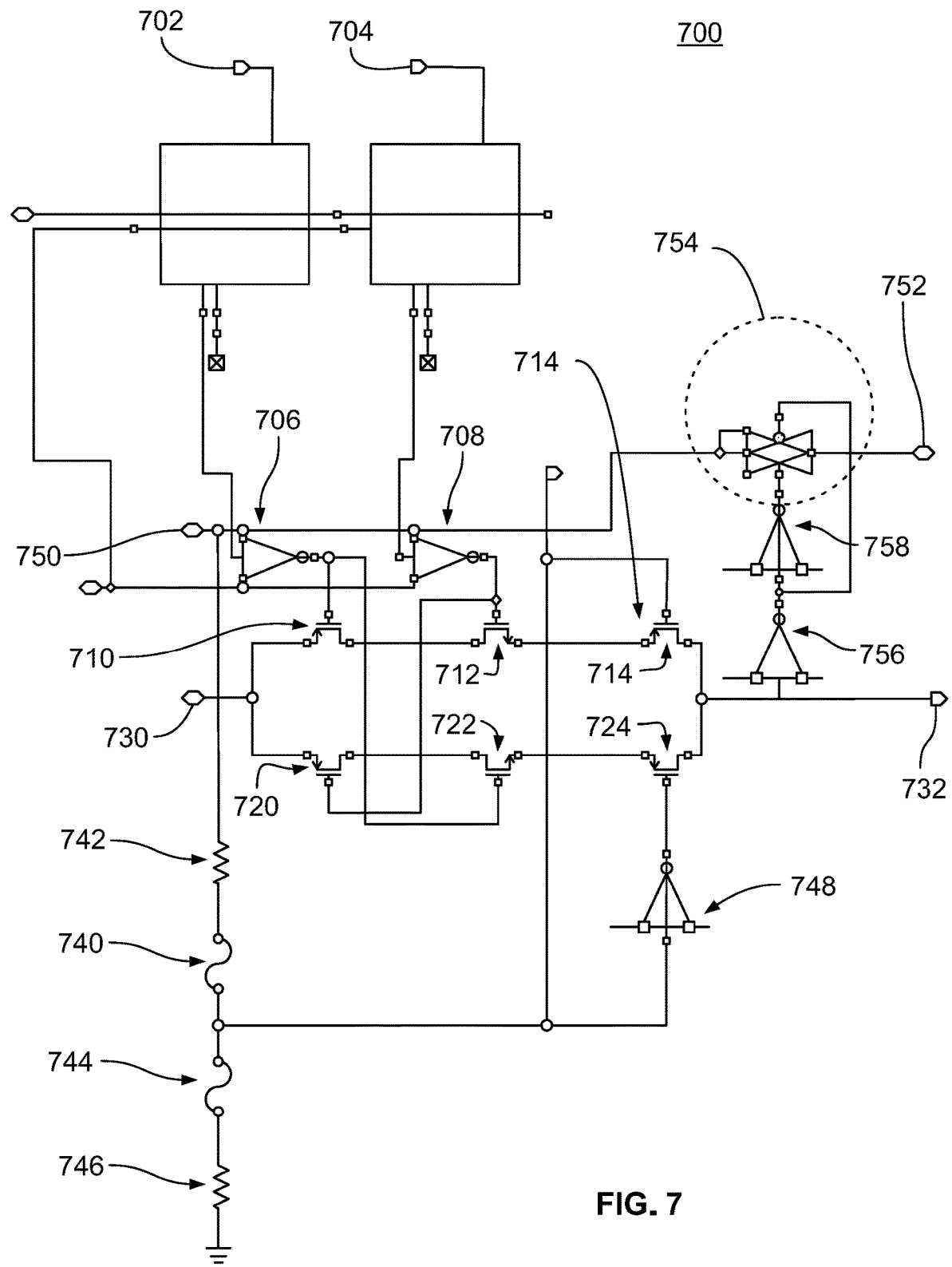
FIG. 7 illustrates a CMOS circuitry implementation of a single stage of a maze functional block in accordance with one or more embodiments of the present invention.

FIG. 7 illustrates one, of many potential, CMOS circuitry implementations of the single stage 600 described above with reference to FIG. 6. The CMOS stage 700 includes two entered maze character inputs 702, 704, corresponding to the A and B inputs, for example, the A_Maze_Output 460 and the B_Maze_Output 465 signals, received from the logic/storage functional block 130. The A and B inputs may be hardwired from the logic/storage functional block 130 or they may come from corresponding opto-isolators. The A and B inputs are subsequently inverted and buffered by inverting buffers 706, 708, respectively. The thus inverted A input is applied to the gate of a first left branch p-channel MOSFET 710 and to the gate of a second right branch n-channel MOSFET 722. The thus inverted B input is applied to the gate of a second left branch n-channel MOSFET 712 and to the gate of a first right branch p-channel MOSFET 720. The sources of the first left branch p-channel MOSFET 710 and the first right branch p-channel MOSFET 720 are both tied to a Vmzpwr node 730, which corresponds to the stage power input. The Vmzpwr node 730 will be electrically connected to power, if the stage 700 is the first of the T stages in the maze functional block 140, or to the Vmzout node 732, which corresponds to the stage power output, of the immediately previous stage in the maze functional block 140 if the stage 700 is not the first of the T stages in the maze functional block 140. If the entered maze pattern character and its directional complement correspond to the required maze pattern character for the stage 700, then the Vmzpwr node 730 will be electrically connected to the Vmzout node 732, i.e., power will be passed through the stage 700. Conversely, if the entered maze pattern character and its directional complement do not correspond to the required maze pattern character for the stage, then the Vmzpwr node 730 will not be electrically connected to the Vmzout node 732, and power will not be passed through the stage. As will be appreciated by one of skill in the art, if the entered maze pattern character and its directional complement of any previous stage did not correspond to the required maze pattern character for that previous stage, then there will be no power at the Vmzpwr node 730.

Fuses 740, 744 are used to store the required maze character for the stage 700. The fuses 740, 744 in some embodiments may be electrical fuses, i.e., ones that may be opened electrically, for example, through the application of an appropriate voltage or current when the required maze pattern is set in the maze functional block 140. The fuses 740, 744 in other embodiments may be optical fuses, i.e., ones that may be opened optically, for example, through the application of a laser beam when the required maze pattern is set in the maze functional block 140. The fuses 740, 744 in other embodiments may be replaced by anti-fuses, i.e., devices that are normally open, but that may be closed, typically through application of an appropriate voltage or current, when the required maze pattern is set in the maze functional block 140.

Once one of the fuses 740, 744 has been opened at the factory when the required maze pattern is set in the maze functional block 140, the required maze pattern can only be reset by the factory, it cannot be reset in the field. As will be appreciated by one of skill in the art, only one of the two fuses 740, 744 will be opened when the required maze pattern is set in the maze functional block 140; the other one of the two fuses 740, 744 will remain closed to ensure the proper voltage is applied to the gate of a third left branch p-channel MOSFET 714 and an inverting buffer 748. As will also be appreciated by one of skill in the art, the one of the fuses 740, 744 is opened after the maze functional block 140 is fabricated, i.e., opening the one of the fuses 740, 744 is a post-fabrication process. This post-fabrication process simplifies setting the required maze pattern as any number of identical maze functional blocks 140 may be fabricated simultaneously, with the required maze patterns set individually after fabrication. As will also be appreciated by one of skill in the art, should one desire multiple maze-based switches 100 having the same required maze pattern, the two fuses 740, 744 may be replaced by hard-wiring as part of the fabrication process using, for example, a photolithographic mask. This hard-wiring approach obviates the need for any post-fabrication process.

The first terminal of the fuse 740 is electrically connected to a Vmzctl node 750 via a resistor 742. The Vmzctl node 750 will have power only if the entered maze pattern character and its directional complement for all previous stages correspond to the required maze pattern character for each corresponding previous stage. The first terminal of the fuse 744 is electrically connected to ground via a resistor 746. The second terminals of the fuses 740, 744 are both electrically connected to the gate of the third left branch p-channel MOSFET 714. The second terminals of the fuses 740, 744 are also both electrically connected to the gate of a third right branch p-channel MOSFET 724 via the inverting buffer 748.

The Vmzctl node 750 is electrically connected to a Vmzctl_out node 752 via a transmission gate 754. The signal at the Vmzctl_out node 752 is electrically connected to the Vmzctl node 750 of the subsequent stage of the maze functional block 140. The transmission gate 754 is controlled by a pair of inputs from a serial pair of inverting buffers 756, 758. The input to the first inverting buffer 756 is the signal at the node Vmzout 732, with the result that if power is present at the node Vmzout 732, then the transmission gate 754 will be ON, i.e., in a highly conductive state, and the signal at the Vmzctl node 750 will be electrically connected to the Vmzctl_out node 752. In contrast, if power is not present at the node Vmzout 732, indicating that the entered maze pattern character and its directional complement were incorrect, then the transmission gate 754 will be OFF, i.e., in a non-conductive state, and the signal at the Vmzctl node 750 will not be electrically connected to the Vmzctl_out node 752. Note that proper operation of the stage 700 requires that the voltage at the Vmzctl node 750 be more than one threshold voltage (Vth-n) greater than the voltage at the Vmzpwr node 730 to ensure that first left branch p-channel MOSFET 710 and the first right branch p-channel MOSFET 720 have reasonably low resistance.

While the embodiment described above with reference to FIG. 7 employed fuses to store the required maze pattern characters, other embodiments may employ other permanent storage elements. For example, other embodiments may employ a nonvolatile memory, a flash memory, a memristor-based memory, a phase-change-based memory, or a latching switch-based memory. In each case, the ability to store to the permanent storage element in the field should be disabled at the factory after the required maze pattern has been stored. This disabling may include, for example, disconnecting one or more leads of the permanent storage element, such as a Write_Enable lead. As will be described below, other embodiments may permit resetting of the required maze pattern in the field.

The embodiment of the present invention described above with reference to FIG. 7 employed fuses to store the required maze pattern characters and indirectly drive operation of the third left branch p-channel MOSFET 714 and the third right branch p-channel MOSFET 724. In other embodiments, the third left branch p-channel MOSFET 714 and the third right branch p-channel MOSFET 724 are each replaced by a corresponding fuse or anti-fuse. As will also be appreciated by one of skill in the art, one of the fuses/anti-fuses replacing the third left branch p-channel MOSFET 714 or the third right branch p-channel MOSFET 724 will be opened/closed after the maze functional block 140 is fabricated, i.e., opening/closing the one of the fuses/anti-fuses is a post-fabrication process. This post-fabrication process simplifies setting the required maze pattern as any number of identical maze functional blocks 140 may be fabricated simultaneously, with the required maze patterns set individually after fabrication.

As noted above, some embodiments may permit setting or resetting of the required maze pattern in the field. These settable/resettable required maze pattern embodiments may, for example, employ rewritable permanent storage elements such as flash memory cells, to store the updated required maze pattern. In these embodiments, each stage in the maze will require a corresponding cell in the rewritable permanent storage element to store the corresponding required maze pattern character. Referring to FIG. 6, the state of the third serial switches 626, 636, i.e., ON (closed) or OFF (open) is determined by the required maze pattern character stored in the rewritable permanent storage element for the corresponding stage. As will be appreciated by one of skill in the art, only one of the third serial switches 626, 636, will be ON (closed), while the other is OFF (open). This embodiment has the feature that an initial or default required maze pattern may be programmed at the factory. For example, the initial required maze pattern may be set to all "A"s or all "B"s.

In a closely related embodiment, a pair of cells in the nonvolatile permanent storage element may be employed for each stage of the maze. Specifically, one of the cells of the rewritable permanent storage elements is assigned to the third serial switch 626 in the left branch 620, while the other cell in the rewritable permanent storage element is assigned to the third serial switch 636 in the right branch 630. This embodiment, like the previous embodiment, can have an initial required maze pattern set at the factory, for example, all "A"s or all "B"s. Unlike the previously described embodiments, the inclusion of a pair of rewritable cells in the permanent storage elements for each stage of the maze permits setting a stage to accept either A or B as the correct input. Stated differently, the required maze pattern character can be set to A or B, as opposed to the A NOT B or B NOT A described in the previous embodiments.

In both nonvolatile permanent storage element embodiments just described, a properly designed controlling circuit for the maze functional block 140 may allow the user to change the required maze pattern. This permits the user to, for example, change a required maze pattern, for example, a password, should the need or desire arise.

In certain embodiments of the present invention that employ a pair of cells in the rewritable permanent storage element for each stage in either the logic/storage functional block 130 or the maze functional block, the pair of cells of the rewritable permanent storage element for each stage may be set to NOT A and NOT B, respectively. This state with NOT A and NOT B may correspond to a reset or initial state, both of which will require subsequent programming of the required maze pattern prior to operation of the maze-based switch 100. With respect to a stage in a maze, the state NOT A and NOT B will not select either of the two branches. Attempts to store A and B in respective cells of the rewritable permanent storage element for each stage would result in an invalid state and are ignored as a required maze pattern comprising A and B for each stage would accept any entered maze pattern.

In at least one embodiment, the maze functional block is implemented using nano-photonics. When the maze functional block is implemented using nano-photonics, and the logic/storage functional block is optically isolated from the maze functional block, the operating wavelength used in the opto-isolators, i.e., the opto-isolator wavelength, for optical isolation is preferably different from the operating wavelength used in the nano-photonics of the maze functional block, i.e., the maze wavelength, to provide additional safety and protection for the maze-based switch.

When the maze functional block is implemented using nano-photonics, i.e., a photonic maze functional block, a correct entered maze pattern and its directional complement will cause an optical signal at the maze optical power input to the photonic maze functional block to be optically coupled to the maze optical power output of the photonic maze functional block. To this end, the photonic maze functional block is implemented using optical switches, such as the one illustrated in FIG. 8.

Figure 8:
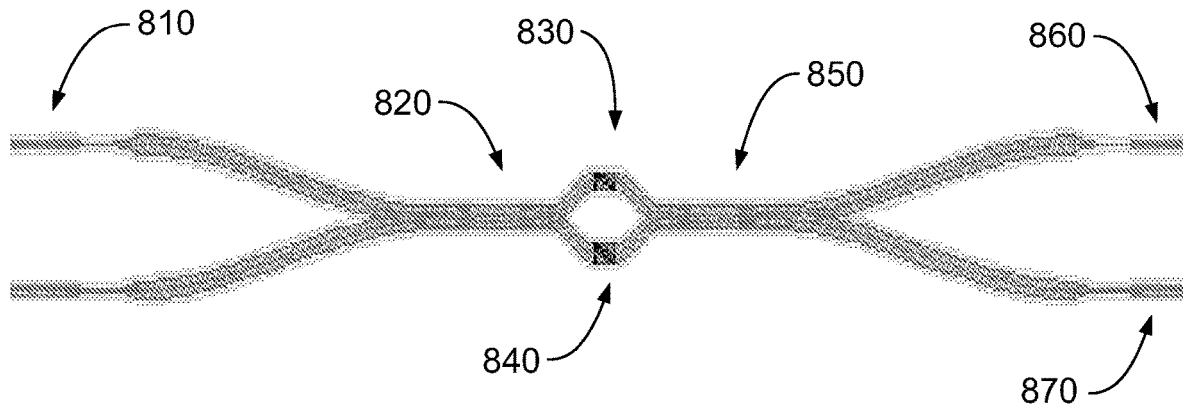
FIG. 8 illustrates an optical switch including a Mach Zehnder interferometer that may be used in one or more embodiments of the present invention.

The optical switch 800 illustrated in FIG. 8, which comprises a Mach-Zehnder interferometer, includes an input 810, an input coupler 820, first and second phase shifters 830, 840, an output coupler 850, a bar output 860, and a cross output 870. An optical signal is applied to the input 810. A first electrical control signal X is applied to the first phase shifter 830, while a second control signal Y is applied to the second phase shifter 840. At the bar output 860, the optical switch 800 implements the functions X NOT Y and Y NOT X, while the cross output 870 implements the function X Y and NOT X NOT Y. The first and second phase shifters 830, 840 may be implemented, for example, using thermal phase shifters.

Figure 9:
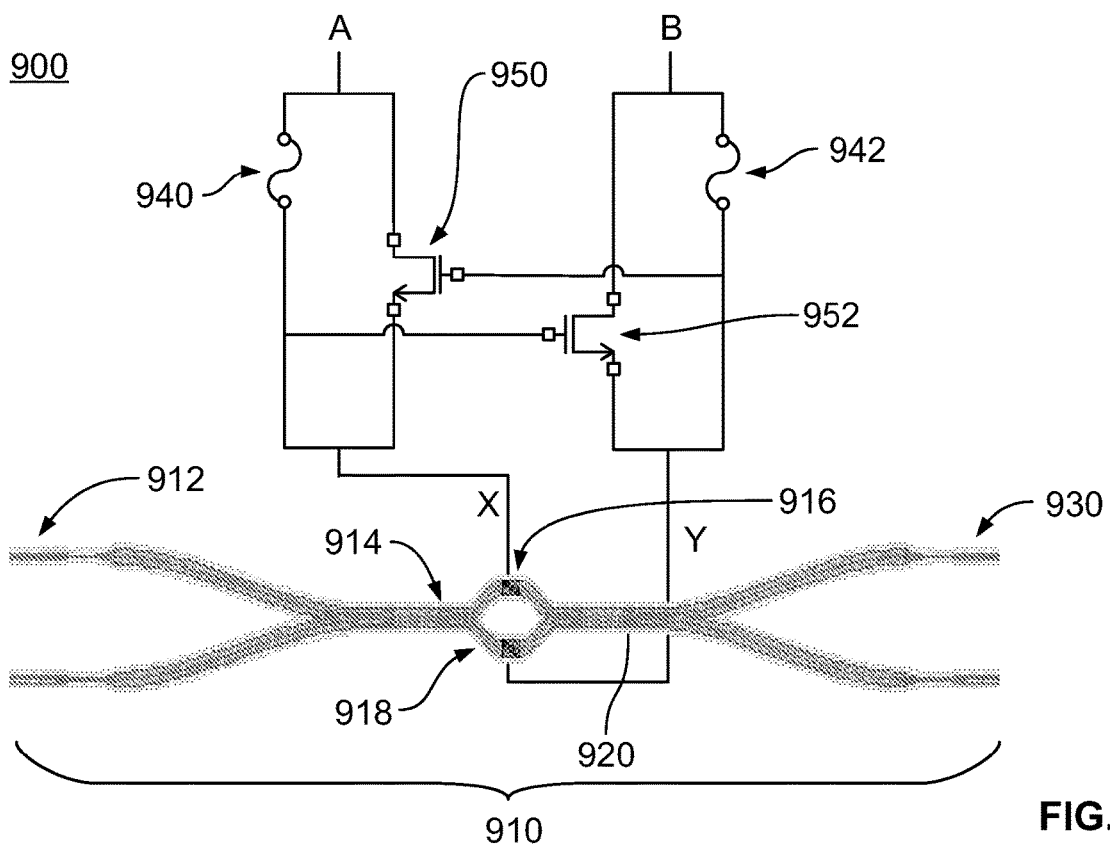
FIG. 9 illustrates an optical implementation of a single stage of a photonic maze functional block in accordance with one or more embodiments of the present invention.

Using a single optical switch as illustrated in FIG. 9, one can implement the desired maze function for a single stage 900 in accordance with at least one embodiment of the present invention. The stage 900 includes an optical switch 910 having a stage optical power input 912. The stage optical power input 912 will be optically coupled to a maze optical power input, if the stage 900 is the first of the T stages in the maze functional block, or to a stage optical power output 930 of the immediately previous stage in the maze functional block if the stage 900 is not the first of the T stages in the maze functional block. The optical switch further includes an input coupler 914, a first phase shifter 916, a second phase shifter 918, an output coupler 920, and the stage optical power output 930 (corresponding to the bar output of the optical switch 910).

A first control signal X and a second control signal Y for the optical switch 910 are generated as follows. Setting the desired required maze pattern character may, for example, be implemented using a pair of fuses 940, 942. The fuses 940, 942 may be either electrical fuses or optical fuses, as described above with reference to the fuses 740, 744. If the required maze pattern character is A NOT B, then the fuse 942 is opened. In this case, the entered maze pattern character A input, corresponding to one of the A_Maze_Output 450 signals received from the logic/storage functional block 400 and assigned to the stage 900, directly becomes the first control signal X. Further, the entered maze pattern character A input is applied to the control gate of a second pass transistor 952. When the entered maze pattern character A input is high, this will cause the second pass transistor 952 to pass the entered maze pattern character B input, corresponding to one of the B_Maze_Output 455 signals received from the logic/storage functional block 400 and assigned to the stage 900. As the entered maze pattern character B input is the directional complement of the entered maze pattern character A input, it will be low. Thus, the control signal X will be high, the control signal Y will be low, and the stage optical power output 930 will be high, assuming the stage optical power input 912 is high.

In contrast, when the entered maze pattern character A input is low, i.e., the entered maze character does not correspond to the required maze pattern character, this will cause the second pass transistor 952 to block the entered maze pattern character B input. Thus, the control signal X will be low, the control signal Y will also be low, and the stage optical power output 930 will be low, regardless of whether the stage optical power input 912 is high or low.

If the required maze pattern character is B NOT A, then the fuse 940 is opened. In this case, the entered maze pattern character B input directly becomes the second control signal Y. Further, the entered maze pattern character B input is applied to the control gate of a first pass transistor 950. When the entered maze pattern character B input is high, this will cause the first pass transistor 950 to pass the entered maze pattern character A input. As the entered maze pattern character A input is the directional complement of the entered maze pattern character B input, it will be low. Thus, the control signal X will be low, the control signal Y will be high, and the stage optical power output 930 will be high, assuming the stage optical power input 912 is high.

In contrast, when the entered maze pattern character B input is low, i.e., the entered maze character does not correspond to the required maze pattern character, this will cause the first pass transistor 950 to block the entered maze pattern character A input. Thus, the control signal X will be low, the control signal Y will also be low, and the stage optical power output 930 will be low, regardless of whether the stage optical power input 912 is high or low.

Two additional cases exist for which the stage 900 will block optical power from the stage optical power input 912 from reaching the stage optical power output 930, i.e., the stage optical power output 930 will be low in each of these cases. The first of these cases is when the entered maze pattern character A input and the entered maze pattern character B input are both low. If the required maze pattern character is A NOT B, the entered maze pattern character A is the control signal X and is low. As the entered maze pattern character A input is applied to the control gate of the second pass transistor 952 and is low, this will cause the second pass transistor 952 to block the entered maze pattern character B input. Thus, the control signal Y will also be low. When both the control signal X and the control signal Y are low, the stage optical power output 930 will be low regardless of the state of the stage optical power input 912. Thus, an attempt to bypass a stage 900 by setting both A and B low, i.e., NOT A NOT B, will fail.

The second case is when the entered maze pattern character A input and the entered maze pattern character B input are both high. If the required maze pattern character is A NOT B, the entered maze pattern character A is the control signal X and is high. As the entered maze pattern character A input is applied to the control gate of the second pass transistor 952 and is high, this will cause the second pass transistor 952 to pass the entered maze pattern character B input. Thus, the control signal Y will also be high. When both the control signal X and the control signal Y are high, the stage optical power output 930 will be low regardless of the state of the stage optical power input 912. Thus, an attempt to bypass a stage 900 by setting both A and B high, i.e., A B, will likewise fail.

As will be appreciated by one of skill in the art, attempts to bypass a stage 900 using either NOT A NOT B or A B when the required maze pattern character is B NOT A will likewise fail for similar reasons.

As will be appreciated by one of skill in the art, the fuses 940, 942 are set after the maze functional block is fabricated, i.e., setting the fuses 940, 942 is a post-fabrication process. This post-fabrication process simplifies setting the required maze pattern as any number of identical maze functional blocks may be fabricated simultaneously, with the required maze patterns set individually after fabrication. In other embodiments, the functionality of the fuses 940, 942, i.e., the storing of a required maze pattern character, may be implemented, at least in part, using anti-fuses, a rewritable memory, a nonvolatile memory, a flash memory, a memristor-based memory, a phase-change-based memory, or a latching switch-based memory.

Figure 10:
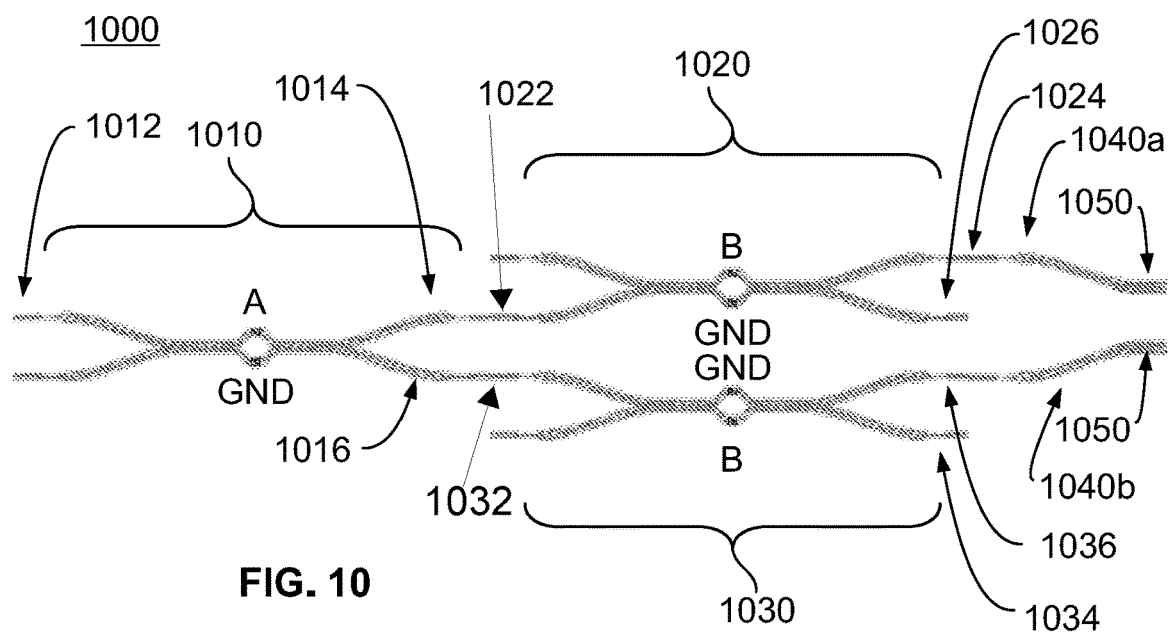
FIG. 10 illustrates an optical implementation of a single stage of a photonic maze functional block in accordance with one or more embodiments of the present invention.

By optically coupling three optical switches as illustrated in FIG. 10, one can implement the desired maze function for a single stage 1000 in accordance with at least one embodiment of the present invention. The stage 1000 includes a first optical switch 1010 having a stage optical power input 1012. The stage optical power input 1012 will be optically coupled to a maze optical power input, if the stage 1000 is the first of the T stages in the maze functional block, or to a stage optical power output 1050 of the immediately previous stage in the maze functional block if the stage 1000 is not the first of the T stages in the maze functional block. An electrical control signal A, corresponding to the one of the A_Maze_Output 450 signals received from the logic/storage functional block 400 and assigned to the stage 1000, is applied to a first phase shifter of the first optical switch 1010, while ground is applied to a second phase shifter. Stated differently, in this embodiment for the first optical switch 1010, the first control signal X corresponds to the one of the A_Maze_Output 450 signals received from the logic/storage functional block 400 and assigned to the stage 1000, while the second control signal Y is ground. A bar output 1014 of the first optical switch 1010 implements the function A, while a cross output 1016 of the first optical switch 1010 implements the function NOT A.

The stage 1000 includes a second optical switch 1020 having an optical input 1022 optically coupled to the bar output 1014 of the first optical switch 1010. An electrical control signal B, corresponding to the one of the B_Maze_Output 455 signals received from the logic/storage functional block 400 and assigned to the stage 1000, is applied to a first phase shifter of the second level optical switch 1020, while ground is applied to a second phase shifter. Stated differently, in this embodiment for the second optical switch 1020, the first control signal X corresponds to the one of the B_Maze_Output 450 signals received from the logic/storage functional block 400 and assigned to the stage 1000, while the second control signal Y is ground. At a cross output 1024 of the second optical switch 1020, the second optical switch 1020 implements the function A NOT B, while a bar output 1026 of the second optical switch 1020 implements the function A B.

The stage 1000 includes a third optical switch 1030 having an optical input 1032 optically coupled to the cross output 1016 of the first optical switch 1010. The electrical control signal B, again corresponding to the one of the B_Maze_Output 455 signals received from the logic/storage functional block 400 and assigned to stage 1000, is applied to a first phase shifter of the third optical switch 1030, while ground is applied to a second phase shifter. Stated differently, in this embodiment for the third optical switch 1030, the first control signal X corresponds to the one of the B_Maze_Output 450 signals received from the logic/storage functional block 400 and assigned to the stage 1000, while the second control signal Y is ground. At a bar output 1036 of the third optical switch 1030, the third optical switch 1030 implements the function B NOT A, while a cross output 1034 of the third optical switch 1030 implements the function NOT B NOT A.

The stage 1000 includes a waveguide 1040*a*, 1040*b* optically coupled to the cross output 1024 of the second optical switch 1020 and the bar output 1036 of the third optical switch 1030 and a stage optical power output 1050, respectively. The specific waveguide 1040*a*, 1040*b* determines whether the required maze pattern character for the stage 1000 is A NOT B or B NOT A, respectively. In some embodiments, the waveguide 1040*a*, 1040*b* may be fabricated during fabrication of the remainder of the maze functional block using e-beam exposure of a photoresist used to define the waveguide 1040*a*, 1040*b* at the same time as other optical elements are being defined. As will be appreciated by one of skill in the art, the waveguide 1040*a*, 1040*b* is formed while the maze functional block is being fabricated, i.e., forming the waveguide 1040*a*, 1040*b* is not a post-fabrication process. Because forming the waveguide 1040*a*, 1040*b* in accordance with this embodiment is not a post-fabrication process, setting the required maze pattern is more difficult as every maze functional block will require a different e-beam exposure pattern.

In other embodiments, the waveguide 1040*a*, 1040*b* may be formed of photoresist after fabrication of the remainder of the maze functional block, i.e., as a post-fabrication process. In still other embodiments, the waveguide 1040*a*, 1040*b* may be formed by three-dimensional printing using an additive manufacturing technique after fabrication of the remainder of the maze functional block, i.e., as a post-fabrication process. Either of these post-fabrication processes simplifies setting the required maze pattern as any number of identical maze functional blocks may be fabricated simultaneously, with the required maze patterns set individually after fabrication.

In yet other embodiments, both waveguides 1040*a*, 1040*b* are formed and are combined with a coupler (not illustrated) with the output of this coupler corresponding to the stage optical power output 1050. The required maze pattern character is set by causing one of the waveguides 1040*a*, 1040*b* to be very lossy. This may be done, for example, by partially ablating one of the waveguides 1040*a*, 1040*b* with a laser beam in a post-fabrication process. This post-fabrication process simplifies setting the required maze pattern as any number of identical maze functional blocks may be fabricated simultaneously, with the required maze patterns set individually after fabrication.

Figure 11:
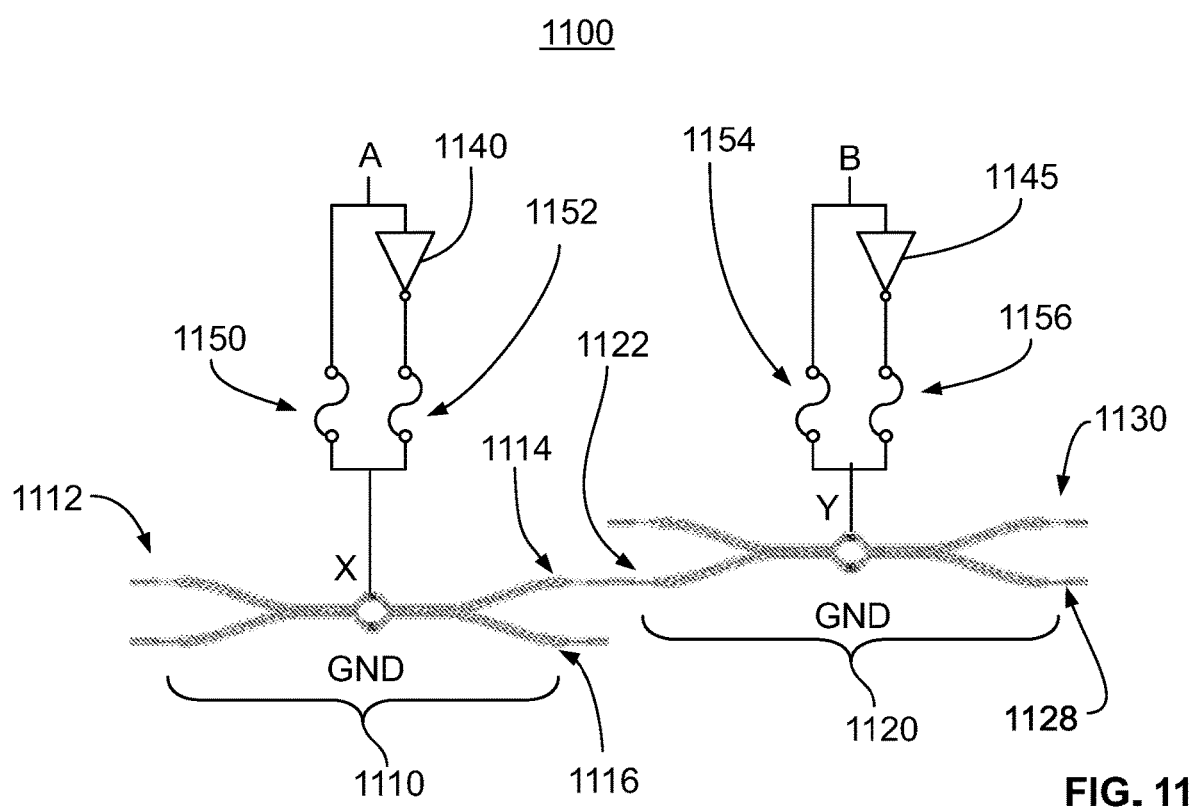
FIG. 11 illustrates an optical implementation of a single stage of a photonic maze functional block in accordance with one or more embodiments of the present invention.

By optically coupling two optical switches as illustrated in FIG. 11, one can implement the desired maze function for a single stage 1100 in accordance with at least one embodiment of the present invention. The stage 1100 includes a first optical switch 1110 having a stage optical power input 1112. The stage optical power input 1112 will be optically coupled to a maze optical power input, if the stage 1100 is the first of the T stages in the maze functional block, or to a stage optical power output 1130 of the immediately previous stage in the maze functional block if the stage 1100 is not the first of the T stages in the maze functional block. An electrical control signal X is applied to a first phase shifter of the first optical switch 1110, while ground is applied to a second phase shifter. At a bar output 1114 of the first optical switch 1110, the first optical switch 1110 implements the function X, while a cross output 1116 of the first optical switch 1110 implements the function NOT X.

The stage 1100 includes a second optical switch 1120 having an optical input 1122 optically coupled to the bar output 1114 of the first optical switch 1110. An electrical control signal Y is applied to a first phase shifter of the second optical switch 1120, while ground is applied to a second phase shifter. At a stage optical power output 1130 of the second optical switch 1120, corresponding to the cross output of the second optical switch 1120, the second optical switch 1120 implements the function X NOT Y, while a bar output 1128 of the second optical switch 1020 implements the function X Y.

The stage 1100 may implement either the A NOT B function or the B NOT A function based upon the control signals X and Y. If the desired required maze pattern character for the stage 1100 is A NOT B, the entered maze pattern character A input, corresponding to one of the A_Maze_Output 450 signals received from the logic/storage functional block 400 and assigned to the stage 1100, is applied directly to the first phase shifter of the first optical switch 1110, i.e., A is the control signal X. The entered maze pattern character B input, corresponding to one of the B_Maze_Output 455 signals received from the logic/storage functional block 400 and assigned to the stage 1100, is applied directly to the first phase shifter of the second optical switch 1120, i.e., B is the control signal Y. If the entered maze pattern character and its directional complement are correct, i.e., A NOT B, then the stage optical power output 1130 of the second optical switch 1120 will be high, assuming the stage optical power input 1112 was high. If, however, the entered maze pattern character and its directional complement are incorrect, i.e., B NOT A, then the bar output 1114 of the first optical switch 1110 will be low, causing the stage optical power output 1130 of the second optical switch 1120 to also be low.

If the desired required maze pattern character for the stage 1100 is B NOT A, the entered maze pattern character A input, corresponding to one of the A_Maze_Output 450 signals received from the logic/storage functional block 400 and assigned to the stage 1100, must be inverted by a first inverting buffer 1140, with the resulting NOT A signal being applied to the first phase shifter of the first optical switch 1110, i.e., NOT A is the control signal X. The entered maze pattern character B input, corresponding to one of the B_Maze_Output 455 signals received from the logic/storage functional block 400 and assigned to the stage 1100, must be inverted by a second inverting buffer 1145, with the resulting NOT B signal being applied to the first phase shifter of the second optical switch 1120, i.e., NOT B is the control signal Y. If the entered maze pattern character and its directional complement are correct, i.e., B NOT A, then the stage optical power output 1130 of the second optical switch 1120 will be high, assuming the optical input 1112 was high. If, however, the entered maze pattern character and its directional complement are incorrect, i.e., A NOT B, then the bar output 1114 of the first optical switch 1110 will be low, causing the stage optical power output 1130 of the second optical switch 1120 to also be low.

The desired required maze pattern character, which either does or does not use the pair of inverting buffers 1140, 1145, may, for example, be implemented using a set of fuses 1150, 1152, 1154, 1156. The fuses 1150, 1152, 1154, 1156 may be either electrical fuses or optical fuses, as described above with reference to the fuses 740, 744. If the required maze pattern character is A NOT B, which does not require use of the pair of inverting buffers 1140, 1145, fuses 1152, 1156 are opened such that the desired noninverted input signals are applied to the first phase shifter of the first optical switch 1110 and the first phase shifter of the second optical switch 1120. Conversely, if the required maze pattern character is B NOT A, which does require use of the pair of inverting buffers 1140, 1145, fuses 1150, 1154 are opened such that the desired inverted input signals are applied to the first phase shifter of the first optical switch 1110 and the first phase shifter of the second optical switch 1120. As will be appreciated by one of skill in the art, the fuses 1150, 1152, 1154, 1156 are set after the maze functional block is fabricated, i.e., setting the fuses 1150, 1152, 1154, 1156 is a post-fabrication process. This post-fabrication process simplifies setting the required maze pattern as any number of identical maze functional blocks may be fabricated simultaneously, with the required maze patterns set individually after fabrication.

In other embodiments, the functionality of the fuses 1150, 1152, 1154, 1156, i.e., the storing of a required maze pattern character, may be implemented, at least in part, using anti-fuses, a rewritable memory, a nonvolatile memory, a flash memory, a memristor-based memory, a phase-change-based memory, or a latching switch-based memory.

The stages 900, 1000, 1100 will impose some loss on the optical signal that passes from their stage optical power inputs to their stage optical power outputs. To counter this optical loss, a photonic maze functional block may employ one or more optical amplifiers. The one or more optical amplifiers may, for example, be placed between the stages 900, 1000, 1100. The total number of optical amplifiers depends, at least in part, upon the loss per stage 900, 1000, 1100 and the gain of the one or more optical amplifiers. In some embodiments, the optical amplifiers are only powered when the entered maze pattern character for the stage 900, 1000, 1100 is correct, thereby adding an additional layer of protection.

In some embodiments of the present invention, a second maze-based switch may be employed to control electrical power to the one or more optical amplifiers. In these embodiments, a first maze-based switch receives a first entered maze pattern, and if it corresponds to the required maze pattern for the first maze-based switch, then the first maze-based switch electrically connects power to the one or more optical amplifiers of the photonic maze functional block of the second maze-based switch. The second maze-based switch receives a second entered maze pattern and, if it corresponds to the required maze pattern for the second maze-based switch, then the optical signal coupled to the optical power input of the optical maze functional block of the second maze-based switch is passed to its optical power output. These embodiments are thus essentially a cascade of two maze-based switches, with the second maze-based switch effectively being the connected element of the first maze-based switch.

In some embodiments of the present invention, the first optical switch 1110, the second optical switch 1120, or both optical switches 1110, 1120, are replaced by electrically powered optical amplifiers. In these embodiments, when the optical amplifier is not powered, it acts as a lossy element and any input optical signal will be attenuated such that its power will be too low to pass through the maze functional block. In contrast, when the optical amplifier is powered, it acts as a gain element and any input optical signal will be amplified such that its power will be great enough to pass through the stage 1100. In still other embodiments, the first optical switch 1110, the second optical switch 1120, or both optical switches 1110, 1120, are replaced by other electrically controlled elements that can pass or attenuate an optical signal.

The above-described embodiments of the present invention described maze functional blocks that pass a single electrical or optical channel. In other embodiments, the maze functional block passes multiple electrical channels simultaneously, for example, by including N parallel strings of T stages, thereby passing N parallel electrical channels. Such an embodiment might be used to control the flow of parallel electrical signal streams. In like manner, N parallel strings of T stages employing nano-photonics could pass N parallel optical signal channels. In yet other embodiments, each of the N parallel strings of T stages would require their own corresponding entered maze patterns.

One exemplary application of one or more embodiments is a smart card that is inserted into a host system, for example, an automated teller machine (ATM), to access its functions. The smart card has two maze-based switches, with the switches corresponding to a password and biometric data, respectively. The password maze-based switch is operated by a user entered password, which, in certain embodiments, may be changed at will. The biometric data maze-based switch is operated by biometric data, for example, a fingerprint, a retina scan, etc. The biometric data maze-based switch cannot by changed, i.e., it is permanent. The result is a smart card that implements two-factor authentication without the host system, for example, the ATM, knowing the two required patterns of information.

The circuitry that sets the two required maze patterns, for example, the password and the biometric data, may be included in the host system. In this embodiment, the smart card thus includes only a pair of maze functional blocks 140 with corresponding permanent storage elements storing the required maze patterns. The host system includes the external system controller 105, the communication functional block 120, and the logic/storage functional block 130. The host system would include, for example, a keypad whereby the user could enter a password, as well as a scanner, for example, a fingerprint or retina scanner, for entering the biometric data.

The smart card in this embodiment does not contain the password and the biometric data in readable permanent storage elements. Thus, if the smart card is lost, the security of the corresponding host system is not readily compromised. One would need to access the maze functional block and determine the specific required maze pattern for not one but two separate mazes—a difficult task.

In another embodiment, the pattern of information bits, i.e., the entered maze pattern and the required maze pattern, may be dynamic and depend, for example, on a location, functionality, time, or other dynamic factor. For example, a first entered maze pattern and corresponding required maze pattern might be used at a first location, while a second entered maze pattern and corresponding required maze pattern might be used at a second location. This location-based dynamic entered maze pattern and required maze pattern might be used as an added security measure such that a single smart card might be used at ATMs belonging to different banks. As another example, a first password is required for accessing a first functionality of a connected element, while a second password is required for accessing a second functionality of a connected element. This functionality-based dynamic entered maze pattern and required maze pattern might be used as an added security measure such that a smart card requires a first password to access a checking account and a second password to access a savings account. As yet another example, a first password is required during a first set of hours, while a second password is required during a second set of hours. This time-based dynamic entered maze pattern and required maze pattern might be used as an added security measure such that a smart card requires a first password to access an ATM during the day and a second, possibly more complex, password to access the ATM at night. A dynamic required maze pattern will necessarily require a more complex maze functional block with, for example, some type of input, such as a sensor, for determining the dynamic factor, and thereby enable updating the required maze pattern as a function of the dynamic factor, for example, location, function, or time.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A maze-based switch comprising:
a maze functional block adapted to receive an entered maze pattern, the entered maze pattern including a sequence of T entered maze pattern characters, the maze functional block adapted to receive a directional complement of the entered maze pattern, the directional complement of the entered maze pattern including a sequence of T directional complements of the entered maze pattern characters, the maze functional block adapted to store a sequence of T required maze pattern characters, the maze functional block including a maze power input, a maze power output, and a string of T stages, each stage of the string of T stages including:
a stage power input;
a stage power output, the stage power input electrically connected to the maze power input when the stage is a first stage of the string of T stages, the stage power input electrically connected to the stage power output of an immediately previous stage when the stage is not the first stage of the string of T stages, the stage power output electrically connected to the maze power output when the stage is a last stage of the string of T stages;
wherein the stage power input is electrically connected to the stage power output only when a respective one of the T entered maze pattern characters and a respective one of the directional complements of the T entered maze pattern characters correspond to a respective one of the T required maze pattern characters.

2. The maze-based switch of claim 1, wherein the stage power input is electrically connected to the stage power output when each of a respective one of the T entered maze pattern characters and each of a respective one of the directional complements of the T entered maze pattern characters correspond to each of a respective one of the T required maze characters for each of the previous stages of the string of T stages.

3. The maze-based switch of claim 1, wherein each stage of the string of T stages further includes:
a first left switch adapted to be controlled by a respective one of the T entered maze pattern characters;
a second left switch adapted to be controlled by a directional complement of a respective one of the T entered maze pattern characters;
a third left switch adapted to be ON only when a respective one of the T required maze characters has a first value;
wherein the first left switch, the second left switch, and the third left switch are electrically connected in series between the stage power input and the stage power output;
a first right switch adapted to be controlled by a logical complement of the respective one of the directional complements of the T entered maze pattern characters;
a second right switch adapted to be controlled by a logical complement of the respective one of the T entered maze pattern characters; and
a third right switch adapted to be ON only when a respective one of the T required maze characters has a second value different from the first value;
wherein the first right switch, the second right switch, and the third right switch are electrically connected in series between the stage power input and the stage power output; and wherein when the stage power input is electrically connected to the stage power output, the stage power input is electrically connected to the stage power output via the first left switch, the second left switch, and the third left switch or the first right switch, the second right switch, and the third right switch.

4. The maze-based switch of claim 1, wherein the maze functional block is adapted to store the sequence of T required maze pattern characters using one of a plurality of fuses, a plurality of anti-fuses, a nonvolatile memory, a flash memory, a memristor-based memory, a phase-change-based memory, a latching switch-based memory, or hard-wiring.

5. The maze-based switch of claim 1, wherein the maze functional block includes one of a plurality of transistors, a plurality of metal-oxide-semiconductor field effect transistors (MOSFETs), a plurality of heterojunction bipolar transistors (HBTs), or a plurality of micro-electro-mechanical system switches.

6. The maze-based switch of claim 1,
wherein the sequence of T required maze pattern characters is one of static or dynamic;
wherein the sequence of T required maze pattern characters is one of resettable or non-resettable;
wherein when the sequence of T required maze pattern characters is dynamic, the sequence of T required maze pattern characters is a function of a dynamic factor, the maze functional block further including an input adapted to determine the dynamic factor; and
wherein when the sequence of T required maze pattern characters is resettable, each stage of the string of T stages includes a rewritable permanent storage element for storing a corresponding reset character of a reset sequence of T required maze pattern characters.

7. The maze-based switch of claim 1, wherein the maze functional block includes N parallel strings of T stages.

8. The maze-based switch of claim 7,
wherein N is two;
wherein a first of the two parallel strings of T stages corresponds to a first entered maze pattern; and
wherein a second of the two parallel strings of T stages corresponds to biometric data.

9. The maze-based switch of claim 1, wherein the maze functional block includes N serial strings of T stages.

10. The maze-based switch of claim 1, wherein each of the T entered maze pattern characters and each of the T required maze pattern characters includes one or more digital bits.

11. The maze-based switch of claim 1, wherein when the entered maze pattern is incorrect, the maze functional block is permanently or semi-permanently disabled.

12. The maze-based switch of claim 1 further comprising a logic/storage functional block adapted to receive the entered maze pattern, the logic/storage functional block adapted to store the entered maze pattern in a permanent storage element, the logic/storage functional block adapted to read out the thus stored entered maze pattern characters from the permanent storage element, the logic/storage functional block adapted to output the entered maze pattern and the directional complement of the entered maze pattern to the maze functional block.

13. The maze-based switch of claim 12, wherein the logic/storage functional block is further adapted to generate the directional complement of the entered maze pattern.

14. The maze-based switch of claim 12, wherein the logic/storage functional block is further adapted to store the directional complement of the entered maze pattern.

15. The maze-based switch of claim 12, wherein the permanent storage element includes one of a nonvolatile memory, a flash memory, a memristor-based memory, a phase-change-based memory, or a latching switch-based memory.

16. The maze-based switch of claim 12 further comprising:
a first plurality of T opto-isolators, each of the first plurality of T opto-isolators adapted to transmit a respective one of the sequence of T entered maze pattern characters from the logic/storage functional block and to receive the respective one of the sequence of T entered maze pattern characters at the maze functional block; and
a second plurality of T opto-isolators, each of the second plurality of T opto-isolators adapted to transmit a respective one of the sequence of the directional complement of the T entered maze pattern characters from the logic/storage functional block and to receive the respective one of the sequence of the directional complement of the T entered maze pattern characters at the maze functional block.

17. The maze-based switch of claim 12,
wherein the logic/storage functional block and the maze functional block are formed on a single integrated circuit or on respective integrated circuits; and
wherein each integrated circuit includes one of a field programmable gate array, an application specific integrated circuit, or a microcontroller unit (MCU).

18. The maze-based switch of claim 12, further comprising a communication functional block adapted to receive a command including the entered maze pattern, the communication functional block adapted to output the entered maze pattern to the logic/storage functional block.

19. The maze-based switch of claim 18, wherein the communication functional block is further adapted to generate the directional complement of the entered maze pattern and to output the directional complement of the entered maze pattern to the logic/storage functional block.

20. The maze-based switch of claim 1, further comprising one or more of:
a thermal protection element adapted to disable the maze functional block when the maze-based switch is subjected to a thermal insult;
a mechanical protection element adapted to disable the maze functional block when the maze-based switch is subjected to a mechanical insult; or
an electrical protection element adapted to disable the maze functional block when the maze-based switch is subjected to an electrical insult.

* * * * *